United States Patent [19]

Nakayama et al.

[11] Patent Number: 5,343,429
[45] Date of Patent: Aug. 30, 1994

[54] SEMICONDUCTOR MEMORY DEVICE HAVING REDUNDANT CIRCUIT AND METHOD OF TESTING TO SEE WHETHER OR NOT REDUNDANT CIRCUIT IS USED THEREIN

[75] Inventors: Akio Nakayama; Kazutoshi Hirayama, both of Hyogo, Japan

[73] Assignee: Mitsubishi Denki Kabushiki Kaisha, Tokyo, Japan

[21] Appl. No.: 919,415

[22] Filed: Jul. 27, 1992

[30] Foreign Application Priority Data

Dec. 6, 1991 [JP] Japan .................................. 3-322734

[51] Int. Cl.$^5$ .............................................. G11C 7/00
[52] U.S. Cl. ..................................... 365/200; 365/201
[58] Field of Search ................. 365/200, 201, 230.06; 371/10.3, 21.1

[56] References Cited

U.S. PATENT DOCUMENTS

| | | | |
|---|---|---|---|
| 4,586,170 | 4/1986 | O'Toole et al. | 365/200 |
| 4,866,676 | 9/1989 | Crisp | 365/200 |
| 4,885,721 | 12/1989 | Ratanosaka | 365/200 |
| 4,984,205 | 1/1991 | Sugibayashi | 365/200 |
| 5,034,925 | 7/1991 | Kato | 365/200 |
| 5,195,099 | 3/1993 | Ueda | 365/200 |

FOREIGN PATENT DOCUMENTS 0195412 9/1986 European Pat. Off. .
0241203 10/1987 European Pat. Off. .
0343344 11/1989 European Pat. Off. .

Primary Examiner—Eugene R. LaRoche
Assistant Examiner—A. Zarabian
Attorney, Agent, or Firm—Lowe, Price, LeBlanc & Becker

[57] ABSTRACT

In a semiconductor memory device having a spare memory cell array and a spare column decoder and a spare row decoder as redundant circuits, redundancy detecting circuits for testing to see whether the redundant circuits are used or not after completion of the semiconductor memory device as a product are set so as to be capable of providing particular current signals or voltage signals, which indicate that the redundant circuits are used to predetermined external terminals, in response to an output signal at a predetermined logic level from a spare row decoder activating circuit or a spare column decoder activating circuit. When an external address signal is supplied to the semiconductor memory device, a signal at a logic level according to whether the redundant circuits are used or not is automatically latched in the redundancy detecting circuits in response to an output signal of the spare row decoder activating circuit or the spare column decoder activating circuit, so that it becomes unnecessary to set the state of electric connection in the redundancy detecting circuits according to whether the redundant circuits are used or not in manufacture.

31 Claims, 12 Drawing Sheets

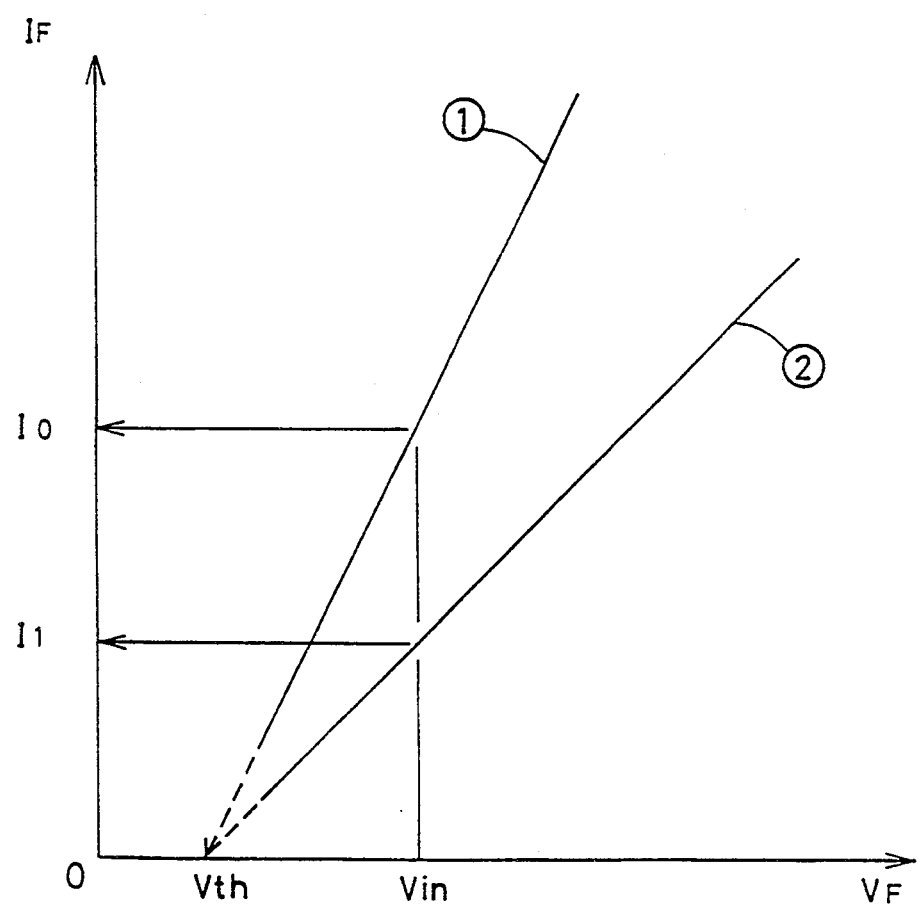
FIG.13         PRIOR ART

SEMICONDUCTOR MEMORY DEVICE HAVING REDUNDANT CIRCUIT AND METHOD OF TESTING TO SEE WHETHER OR NOT REDUNDANT CIRCUIT IS USED THEREIN

BACKGROUND OF THE INVENTION

1. Field of the Invention

The present invention relates to semiconductor memory devices and, more particularly, to a semiconductor memory device having a redundant circuit.

2. Description of the Background Art

Recently, as the storage capacity of a semiconductor memory device is increased, the number of memory cells provided in a semiconductor memory of one chip is remarkably increased. With such increase in the number of memory cells, the ratio of products with no defects in their memory cell array portions to all the semiconductor memory chips manufactured, (so-called "yield") is notably lowered.

Therefore, most of recent semiconductor memory devices include, in addition to memory cell arrays originally to be used (hereinafter referred to as normal memory cell arrays), memory cell arrays to be used in place of the normal memory cell arrays in case defects are generated therein due to causes arising in manufacture (hereinafter referred to as spare memory cell arrays).

Actually, one of memory cell rows or memory cell columns in a spare memory cell array is used in place of a memory cell row or a memory cell column to which a defective memory cell in a normal memory cell array belongs.

FIG. 10 is a schematic block diagram showing the whole configuration of a conventional semiconductor memory device having spare memory cell arrays. FIG. 10 mainly shows circuitry portions serving for controlling operations of normal memory cell arrays and spare memory cell arrays as peripheral circuitry of those memory cell arrays.

Now, referring to FIG. 10, description will be given of the configuration of the conventional semiconductor memory device, mainly of circuit operations performed in the semiconductor memory device for the purpose of using normal memory cell arrays and spare memory cell arrays appropriately.

Each of a plurality of normal memory cell arrays 31-1 to 31-n is provided with two types of spare memory cell arrays (32-1 to 32-n, 33-1 to 33-n).

FIG. 11 is a diagram showing the configuration of arbitrary one of normal memory cell arrays 31-1 to 31-n and the spare memory cell arrays added thereto.

Referring to FIG. 11, each of normal memory cell arrays 31-1 to 31-n includes memory cells MC arranged in a plurality of rows and a plurality of columns, word lines WL provided corresponding, respectively, to the memory cell rows, and bit lines (or bit line pairs) BL provided corresponding, respectively, to the memory cell columns. Each of the word lines WL is connected to all the memory cells MC included in a corresponding one of the memory cell rows, and each of the bit lines (or bit line pairs) BL is connected to all the memory cells MC included in a corresponding one of the memory cell columns.

Each of spare memory cell arrays 32-1 to 32-n includes the plurality of word lines WL, in common with a corresponding one of normal memory cell arrays 31-1 to 31-n, and further includes at least one (or one pair of) spare bit line (or spare bit lines) SBL, independently of the corresponding one of normal memory cell arrays 31-1 to 31-n. A spare memory cell column including spare memory cells SMC of the same number as the number of the word lines WL is provided corresponding to each spare bit line (or spare bit line pair) SBL. Each of the spare memory cells SMC is connected to a corresponding one spare bit line (or bit line pair) SBL and a corresponding one of the word lines WL.

Each of spare memory cell arrays 33-1 to 33-n includes a plurality of bit lines (or bit line pairs) BL, in common with a corresponding one of normal memory cell arrays 31-1 to 31-n, and further includes at least one spare word line SWL, independently of the corresponding one of normal memory cell arrays 31-1 to 31-n. A spare memory cell row including spare memory cells SMC of the same number as the number of the bit lines (or bit line pairs) BL is provided corresponding to each spare word line SWL. Each of the spare memory cells SMC is connected to a corresponding one of the bit lines (or bit line pairs) BL and a corresponding one spare word line SWL.

As shown in FIGS. 10 and 11, normal row decoders 25-1 to 25-n and normal column decoders 42-1 to 42-n are provided to respective normal memory cell arrays 31-1 to 31-n, and spare row decoders 24-1 to 24-n and spare column decoders 41-1 to 41-n are provided to spare memory cell arrays 33-1 to 33-n and spare memory cell arrays 32-1 to 32-n, respectively.

Each of normal row decoders 25-1 to 25-n selectively activates one of the word lines WL in a corresponding one of normal memory cell arrays 31-1 to 31-n. This makes it possible to transfer a data signal between each of the memory cells MC connected to the one word line WL and a corresponding bit line BL.

Each of normal column decoders 42-1 to 42-n makes it possible to withdraw a signal from one of the bit lines (or bit line pairs) BL in a corresponding one of normal memory cell arrays 31-1 to 31-n and to apply an external data signal to the one bit line (or bit line pair) BL. Accordingly, it becomes possible to write and read data into/from one memory cell MC connected to the activated word line WL out of the memory cells MC connected to the one bit line (or bit line pair) BL.

Each of spare row decoders 24-1 to 24-n selectively activates one of the spare word lines SWL in a corresponding one of spare memory cell arrays 33-1 to 33-n. This makes it possible to transfer a data signal between each of the spare memory cells SMC connected to the one spare word line SWL and a corresponding bit line BL.

Each of spare column decoders 41-1 to 41-n makes it possible to withdraw a data signal from one of the spare bit lines (or bit line pairs) SBL in a corresponding one of spare memory cell arrays 32-1 to 32-n and to supply an external data signal to the one bit line (or bit line pair) SBL.

However, each of normal row decoders 25-1 to 25-n and a corresponding one of spare row decoders 24-1 to 24-n do not operate simultaneously, and they are controlled so that only one of them operates. Similarly, each of normal column decoders 42-1 to 42-n and a corresponding one of spare column decoders 41-1 to 41-n do not operate simultaneously, and they are controlled so that only one of them operates.

For example, in a case where there are two or more defective memory cells in the same row or any one of the word lines WL is defective in an arbitrary one of normal memory cell arrays 31-1 to 31-n, it is necessary that one of the spare memory cell rows in one of spare memory cell arrays 33-1 to 33-n provided corresponding to that normal memory cell array is used in place of the memory cell row including the defective memory cells or the memory cell row provided corresponding to the defective word line WL.

Therefore, in such a case, out of the normal row decoder and the spare row decoder corresponding to that normal memory cell array including the defective memory cell row, the spare row decoder is activated in response to an external address signal indicating the defective memory cell row.

At the same time, in one of spare memory cell arrays 32-1 to 32-n corresponding to that normal memory cell array, it becomes possible to transfer a data signal between each of the spare memory cells SMC connected to one of the word lines WL which is activated by operation of a corresponding one of normal row decoders 25-1 to 25-n and a corresponding one of the spare bit lines (or bit line pairs) SBL. Therefore, it becomes possible to write and read data into/from one of the spare memory cell rows in one of the spare memory cell arrays 33-1 to 33-n provided corresponding to the normal memory cell array instead of writing and reading data into/from the defective memory cell row. Specifically, the defective memory cell row is replaced by a non-defective spare memory cell row.

Similarly, in a case where there are two or more defective memory cells MC in the same column or where any one of the bit lines BL is defective in an arbitrary one of normal memory cell arrays 31-1 to 31-n, it is necessary that any one of the spare memory cell columns in one of spare memory cell arrays 32-1 to 32-n provided corresponding to that normal memory cell array is used in place of the memory cell column including the defective memory cell MC or the memory cell column provided corresponding to the defective bit line BL.

Therefore, in such a case, out of one of normal column decoders 42-1 to 42-n and one of spare column decoders 41-1 to 41-n corresponding to the normal memory cell array including that memory cell column, the spare column decoder is activated in response to an external address signal indicating the defective memory cell column.

At the same time, in one of spare memory cell arrays 33-1 to 33-n corresponding to that normal memory cell array, operation of a corresponding one of normal column decoders 42-1 to 42-n makes it possible to write and read data into/from one spare memory cell SMC connected to the activated spare word line SWL out of the spare memory cells SMC connected to one bit line (or bit line pair) BL. Therefore, it becomes possible to write and read data into/from a non-defective spare memory cell column instead of writing and reading data into/from the defective memory cell column. Specifically, the defective memory cell column is replaced by the non-defective spare memory cell column.

Thus, a defective memory cell row and a defective memory cell column in each of normal memory cell arrays 31-1 to 31-n are replaced, respectively, by a spare memory cell row in one of the first spare memory cell arrays 33-1 to 33-n provided corresponding to the normal memory cell array and a spare memory cell column in one of the second spare memory cell arrays 32-1 to 32-n provided corresponding to the normal memory cell array.

In order to perform this replacement, as shown in FIG. 10, spare row decoder activating circuits 21-1 to 21-n are provided corresponding, respectively, to spare row decoders 24-1 to 24-n, and spare column decoder activating circuits 44-1 to 44-n are provided corresponding, respectively, to spare column decoders 41-1 to 41-n.

Each of spare row decoder activating circuits 21-1 to 21-n provides a control signal (SRE1-SREn) for activating either a corresponding one of spare row decoders 24-1 to 24-n or one of normal row decoders 25-1 to 25-n corresponding to that spare row decoder and for deactivating the other in response to an output signal of a row address buffer 20.

Similarly, each of spare column decoder activating circuits 44-1 to 44-n provides a control signal (SCE-1-SCEn) for activating either a corresponding one of spare column decoders 41-1 to 41-n or one of normal column decoders 42-1 to 42-n corresponding to that spare column decoder and for deactivating the other in response to an output of a column address buffer 40.

Row address buffer 20 buffers a row address signal out of external address signals applied through external terminals 23 which indicates in which row in normal memory cell arrays 31-1 to 31-n data should be written or read into/from a memory cell arranged therein and supplies it to normal row decoders 25-1 to 25-n, spare row decoders 24-1 to 24-n, and spare row decoder activating circuits 21-1 to 21-n.

Column address buffer 40 buffers a column address signal out of the above external address signals which indicates in which column in normal memory cell arrays 31-1 to 31-n data should be written or read into/from a memory cell arranged therein and supplies it to normal column decoders 42-1 to 42-n, spare column decoders 41-1 to 41-n, and spare column decoder activating circuits 44-1 to 44-n.

In a case where the column address signal from column address buffer 40 indicates a defective memory cell column in one of normal memory cell arrays 31-1 to 31-n, a corresponding one of spare column decoder activating circuits 44-1 to 44-n activates a corresponding one of spare column decoders 41-1 to 41-n while deactivating a corresponding one of normal column decoders 42-1 to 42-n. In the other case where the column address signal from column address buffer 40 indicates a non-defective memory cell column, each of spare column decoder activating circuits 44-1 to 44-n deactivates a corresponding one of spare column decoders 41-1 to 41-n and activates a corresponding one of normal column decoders 42-1 to 42-n.

Similarly, in a case where the row address signal from row address buffer 20 indicates a defective memory cell row in one of normal memory cell arrays 31-1 to 31-n, a corresponding one of spare row decoder activating circuits 21-1 to 21-n activates a corresponding one of spare row decoders 24-1 to 24-n while deactivating a corresponding one of normal row decoders 25-1 to 25-n. In the other case where the row address signal from row address buffer 20 indicates a non-defective memory cell row, each of spare row decoder activating circuits 21-1 to 21-n deactivates corresponding one of spare row decoders 24-1 to 24-n while activating a corresponding one of normal row decoders 25-1 to 25-n.

Specifically, each of spare column decoder activating circuits 44-1 to 44-n includes a plurality of fuses. Each of spare column decoder activating circuits 44-1 to 44-n has any of the plurality of fuses selectively cut in advance so that its output signal (SCE1-SCEn) activates a corresponding one of spare column decoders 41-1 to 41-n when a column address signal indicating a defective memory cell column in a corresponding one of normal memory cell arrays 31-1 to 31-n is applied thereto from column address buffer 40.

Similarly, each of spare row decoder activating circuits 21-1 to 21-n includes a plurality of fuses. Each of spare row decoder activating circuits 21-1 to 21-n has any of the plurality of fuses selectively cut in advance so that its output signal (SRE1-SREn) is a one capable of activating a corresponding one of spare row decoders 24-1 to 24-n only when a row address signal indicating a defective memory cell row in a corresponding one of normal memory cell arrays 31-1 to 31-n is applied thereto from row address buffer 20.

Each of spare column decoders 41-1 to 41-n makes it possible to supply an external data signal to spare bit line SBL corresponding to one of the memory cell columns in a corresponding one of spare memory cell arrays 32-1 to 32-n and to withdraw a data signal from the spare bit line SBL, in response to a column address signal from column address buffer 40, in a period in which the spare column decoder is activated by a corresponding one of spare column decoder activating circuits 44-1 to 44-n.

Similarly, each of spare row decoders 24-1 to 24-n activates one of the spare word lines SWL provided corresponding to one of the spare memory cell rows in a corresponding one of spare memory cell arrays 33-1 to 33-n, in response to a row address signal from row address buffer 20, in a period in which the spare row decoder is activated by a corresponding one of spare row decoder activating circuits 21-1 to 21-n.

As described above, in order to make it possible to actually use so-called redundant circuits such as spare memory cell arrays 32-1 to 32-n, 33-1 to 33-n, spare column decoders 41-1 to 41-n, and spare row decoders 24-1 to 24-n which are to be used replacing normal memory cell arrays 31-1 to 31-n, normal column decoders 42-1 to 42-n, and normal row decoders 25-1 to 25-n, respectively, circuitry (spare column decoder activating circuits 44-1 to 44-n and spare row decoder activating circuits 21-1 to 21-n) provided for activating those redundant circuits under particular conditions are set to a particular state by cutting fuses during manufacture, for example.

Now, whether such redundant circuits are used or not is important information in carrying out a failure analysis in a semiconductor memory device after manufacture. Therefore, a semiconductor memory device having a redundant circuit is generally provided with a redundancy detecting circuit 22 in order to know whether the redundant circuits are used or not from the semiconductor memory device after manufacture.

A redundancy detecting circuit 22 is provided in the vicinity of any of external terminals 23 and supplies a signal indicating whether the redundancy circuits are used or not to that external terminal in the vicinity.

FIG. 12 is a schematic diagram showing a configuration of a conventional redundancy detecting circuit 22. The configuration and operation of conventional redundancy detecting circuit 22 will be described in the following with reference to FIG. 12.

A conventional redundant circuit includes an N-channel MOS transistor 2 provided between a predetermined external terminal 23 and ground GND and a serial connection circuit of a fuse 4 and an N-channel MOS transistor 3 connected in parallel with transistor 2. Gates of transistors 2 and 3 are grounded.

External terminal 23 is originally provided for transmitting a signal between a circuit part other than redundancy detecting circuit 22 and the outside and externally receives a predetermined negative voltage for operating redundancy detecting circuit 22 only when whether the redundancy circuits are used or not is tested.

In a case where any of the redundant circuits is used, i.e. in a case where any of the fuses in spare column decoder activating circuits 44-1 to 44-n and spare row decoder activating circuits 21-1 to 21-n is cut in advance in FIG. 11, fuse 4 in the redundancy detecting circuit is also cut.

First, an operation of redundant circuit 22 in a case where fuse 4 is not cut will be described.

If a negative voltage is applied to external terminal 23 with its absolute value $V_F$ gradually increased, current starts to flow in interconnection A, which connects external terminal 23 with transistor 2 and fuse 4, at the time when the absolute value $V_F$ becomes larger than respective threshold voltages Vth of transistors 2 and 3. Thereafter, the current flowing in the interconnection A is increased according to increase in the absolute value $V_F$.

FIG. 13 is a graph showing the relation between the absolute value $V_F$ of the negative voltage applied to external terminal 23 and the magnitude of the current flowing in the interconnection A. In FIG. 13, the absolute value $V_F$ is indicated on the abscissa, and the magnitude $I_F$ of the current flowing in the interconnection A is indicated on the ordinate.

Referring to FIGS. 12 and 13, transistors 2 and 3 are both in OFF state so that current does not flow between external terminal 23 and ground GND until the absolute value $V_F$ of the negative voltage applied to external terminal 23 reaches respective threshold voltages Vth of transistors 2 and 3. However, if the absolute value $V_F$ exceeds the respective threshold voltages Vth of transistors 2 and 3, transistors 2 and 3 are both brought to ON state, so that current of a magnitude corresponding to the sum of the current between the source and the drain of transistor 2 and the current between the source and the drain of transistor 3 flows in the interconnection A in the direction of from ground GND toward external terminal 23. If the absolute value $V_F$ of the potential of external terminal 23 is increased, the potential between the gate and the source of each of transistors 2 and 3 is increased, so that the current flowing in the interconnection A is increased in proportion to the absolute value $V_F$ as shown by line ① in FIG. 13.

Now, an operation of redundancy detecting circuit 22 in a case where fuse 4 is cut will be described.

Since fuse 4 is cut, no current flows from ground GND through fuse 4 and transistor 3 to the interconnection A regardless of the polarity and the absolute value of the potential of external terminal 23. Accordingly, if a negative voltage is applied to external terminal 23 with the absolute value $V_F$ of the voltage gradually increased, transistor 2 is in OFF state so that no current flows in the interconnection A until the absolute value $V_F$ reaches the threshold voltage Vth of transistor 2. However, if the absolute value $V_F$ reaches the threshold voltage Vth of transistor 2, transistor 2 is brought to ON state, so that current of a magnitude corresponding to the current between the source and drain of transistor 2 flows in the interconnection A in a direction of from ground GND toward external terminal 23. If the absolute value $V_F$ of the potential of external terminal 23 is increased in the range of the threshold voltage Vth of transistor 2 or more, the magnitude of the current flowing in the interconnection A is increased in proportion to the absolute value $V_F$ as shown by line ② in FIG. 3.

As described above, the current flowing in the interconnection A in a case where a negative voltage having an absolute value Vin larger than the respective threshold value voltages Vth of transistors 2 and 3 is applied to external terminal 23 differs depending on whether fuse 4 is cut or not. Specifically, in a case where fuse 4 is cut, current $I_1$ smaller than current $I_0$ flowing in the interconnection A in a case where fuse 4 is not cut is detected from external terminal 23.

Therefore, in a case where whether the redundant circuits are used or not is tested in the semiconductor memory device after manufacture, a negative voltage having a predetermined absolute value Vin larger than the respective threshold voltages Vth of transistors 2 and 3 is applied to external terminal 23 connected to redundancy detecting circuit 22, and then the magnitude of the current flowing in external terminal 23 is detected. If the detected magnitude of current is smaller than a predetermined reference value, fuse 4 is considered to be cut, so that it is possible to determine that any of the redundant circuits is used in the semiconductor memory device. Conversely, if the detected magnitude of the current is larger than the predetermined reference value, fuse 4 is considered to be not cut, so that it is possible to determine that the redundant circuits are not used in the semiconductor memory device.

The reference value is set, for example, to the magnitude $I_1$ of the current flowing in external terminal 23, which is measured by applying a negative voltage having an absolute value Vin to an external terminal 23 of another semiconductor memory device in which a fuse 4 is not cut.

The reference value is set, for example, to the magnitude of the current flowing between a reference circuit of the same structure as that of redundancy detecting circuit 22, which is provided corresponding to an external terminal other than external terminal 23 connected to redundancy detecting circuit 22, and that external terminal other than external terminal 23 in the semiconductor memory device having redundancy detecting circuit 22.

Specifically, the fuse included in the reference circuit is not cut regardless of whether the redundant circuits are used or not. A negative voltage having an absolute value Vin is applied to the external terminal connected to the reference circuit, and the magnitude of the current flowing in the external terminal is measured. The measured magnitude of the current is used as the above-described reference value.

As described above, the conventional semiconductor memory device having the redundant circuits has a redundancy detecting circuit so that it can test whether the redundant circuits are used or not after completion of the semiconductor memory device as a product. The redundancy detecting circuit includes a fuse which is selectively cut during manufacture according to whether the redundant circuits are used or not.

Whether the redundant circuits are used or not is set by selectively cutting a fuse provided in circuits other than the redundancy detecting circuit.

For example, referring to FIG. 10, whether spare memory cell arrays 32-1 to 32-n and 33-1 to 33-n are used or not is determined depending on whether the fuses in spare column decoder activating circuits 44-1 to 44-n and spare row decoders 24-1 to 24-n are cut during manufacture.

Accordingly, a manufacturing process of the conventional semiconductor memory device having the redundant circuits should include the troublesome step of cutting the fuse in the redundancy detecting circuit in addition to the step of cutting the fuse for determining whether the redundant circuits are used or not.

Furthermore, in the redundancy detecting circuit of the semiconductor memory device completed as a product, the state of the fuses (whether they are cut or not) has been already determined. Therefore, the reference value to be compared with the magnitude of the current measured by applying a predetermined negative voltage to the external terminal connected to the redundancy detecting circuit in order to determine whether the redundant circuits are used or not is not a value obtained by directly measuring the magnitude of the current flowing in the external terminal connected to the redundancy detecting circuit when the fuse in the redundancy detecting circuit is not cut.

Specifically, as described above, a value measured by operating another circuit connected to another external terminal such as a redundancy detecting circuit in another semiconductor memory device in which a fuse is not cut, a reference circuit provided connected to another external terminal in the same semiconductor memory device which has the same structure as that of the redundancy detecting circuit and in which a fuse is not cut, or the like is used.

However, the input impedances of external terminals, capacities of wiring, or the like do not correspond correctly even among circuits having the same structure, so that the value of the current measured by operating such another circuit does not correspond to the magnitude of the current which flows in the external terminal connected to the redundancy detecting circuit to be actually used for determining whether the redundant circuits are used or not when the fuse in the redundancy detecting circuit is not cut.

Therefore, according to the conventional redundancy detecting circuit, the reference value for determining whether the redundant circuits are used or not is incorrect, so that it is not always possible to correctly determine whether the redundant circuits are used or not.

SUMMARY OF THE INVENTION

An object of the present invention is to provide a semiconductor memory device capable of determining whether a redundant circuit is used or not without adding a troublesome manufacturing step.

Another object of the present invention is to provide a semiconductor memory device capable of correctly determining whether a redundant circuit is used or not.

Still another object of the present invention is to provide a semiconductor memory device capable of correctly determining whether a redundant circuit is used or not without adding a troublesome manufacturing step.

A further object of the present invention is to provide a semiconductor memory device capable of determining whether a redundant circuit is used or not without using a fuse.

A still further object of the present invention is to provide a semiconductor memory device in which it does not happen that a predetermined circuit is irreversibly set to a certain state according to whether a redundant circuit is used or not in order to determine whether the redundant circuit is used or not.

According to an aspect of the present invention, a semiconductor memory device includes a normal memory cell array having a plurality of normal memory cells, spare memory cells each being capable of replacing any one of the plurality of normal memory cells, normal selection circuitry for selecting one of the plurality of normal memory cells for writing and reading data, spare selection circuitry for selecting one of the spare memory cells in place of any one of the plurality of normal memory cells, control signal providing circuitry for providing a control signal which activates the spare selection circuitry and deactivates the normal selection circuitry to use the spare memory cell array, and electric circuitry for receiving the control signal. The electric circuitry is set so as to provide a particular electric signal to a predetermined external terminal in response to the control signal from the control signal providing circuitry.

Preferably, the electric circuitry includes circuitry for holding a signal at a predetermined logic level in response to the control signal from the control signal providing circuitry and circuitry for providing a particular electric signal to a predetermined external terminal in response to the held signal.

Since the electric circuitry which is set so as to provide a particular electric signal to the external terminal in response to the control signal generated to use the spare memory cell array is provided, if the semiconductor memory device is made to operate under conditions under which the spare memory cell array should be used, the electric circuitry is set so as to provide a particular electric signal to the external terminal. Accordingly, after the semiconductor memory device is made to operate under conditions under which the spare memory cell should be used, an electric signal according to whether the spare memory cell array and the spare selection circuit are used or not appears onto the external terminal.

According to another aspect of the present invention, a semiconductor memory device includes a normal memory cell array having a plurality of normal memory cells arranged in a plurality of rows and a plurality of columns, a first spare memory cell array having first spare memory cells each being capable of replacing any one of the memory cells arranged in any one of the plurality of rows, a second spare memory cell array having second spare memory cells each being capable of replacing any one of the normal memory cells arranged in any one of the plurality of columns, first nominal selection circuitry for selecting one of the normal memory cells arranged in any one of the plurality of rows for writing and reading data, second normal selection circuitry for selecting one of the normal memory cells arranged in any one of the plurality of columns for writing and reading data, first spare selection circuitry for selecting one of the first spare memory cells in place of one of the plurality of normal memory cells, and second spare selection circuitry for selecting one of the second spare memory cells in place of any one of the plurality of nominal memory cells. The semiconductor memory device further includes first control signal providing circuitry for providing a first control signal which activates the first spare selection circuitry and deactivates the first normal selection circuitry to use the first spare memory cell array, second control signal providing circuitry for providing a second control signal which activates the second spare selection circuitry and deactivates the second normal selection circuitry to use the second spare memory cell array, first electric circuitry which is set so as to provide a particular first electric signal to a first external terminal in response to the first control signal, and second electric circuitry which is set so as to provide a particular second electric signal to a second external terminal in response to the second control signal.

The first and second electric circuitry set so as to provide the particular first and second electric signals to the first and second external terminals, respectively, in response to the first and second control signals generated respectively to use the first and second spare memory cell arrays is provided. Therefore, if the semiconductor memory device is made to operate under conditions under which the first spare memory cell array and/or the second spare memory cell array should be used, the first and/or second electric circuitry are/is set so as to provide particular electric signal(s) to the first external terminal and/or the second external terminal. Accordingly, after the semiconductor memory device is made to operate under conditions under which at least one of the first and second spare memory cell arrays should be used, electric signals according to whether the first spare memory cell array and the first spare selection circuitry are used or not and whether the second memory cell array and the second spare selection circuitry are used or not appear onto the first and second external terminals.

According to still another aspect, a determination method of the present invention is a method of determining whether a spare memory cell array is used or not from a signal provided to an external terminal in a semiconductor memory device including a normal memory cell array having a plurality of normal memory cells, a spare memory cell array having spare memory cells each being capable of replacing any one of the plurality of normal memory cells, an external terminal, nominal selection circuitry for selecting one of the plurality of normal memory cells for writing and reading data, spare selection circuitry for selecting one of the spare memory cells in place of any one of the plurality of normal memory cells, and electric circuitry for providing a particular electric signal, which indicates that the spare memory cell array is used, to the external terminal, and the method includes the step of generating a control signal which activates the spare selection circuitry and deactivates the normal selection circuitry to use the spare memory cell array and the step of operating the electric circuitry in response to the control signal.

According to this method, the circuitry which provides a signal, which indicates that the spare memory cell array is used, is activated in response to the control signal which is generated when the spare memory cell array is actually used. Accordingly, a signal indicating whether the spare memory cell array is used or not appears onto the external terminal when the semiconductor memory device performs a normal operation.

Therefore, according to the present invention, it becomes possible to correctly and easily test to see whether a redundant circuit is used or not without providing fuses to be selectively cut during manufacture according to whether the redundant circuit is used or not.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a graph showing characteristics of the circuit in FIG. 12.

DESCRIPTION OF THE PREFERRED EMBODIMENTS

Figure 1:
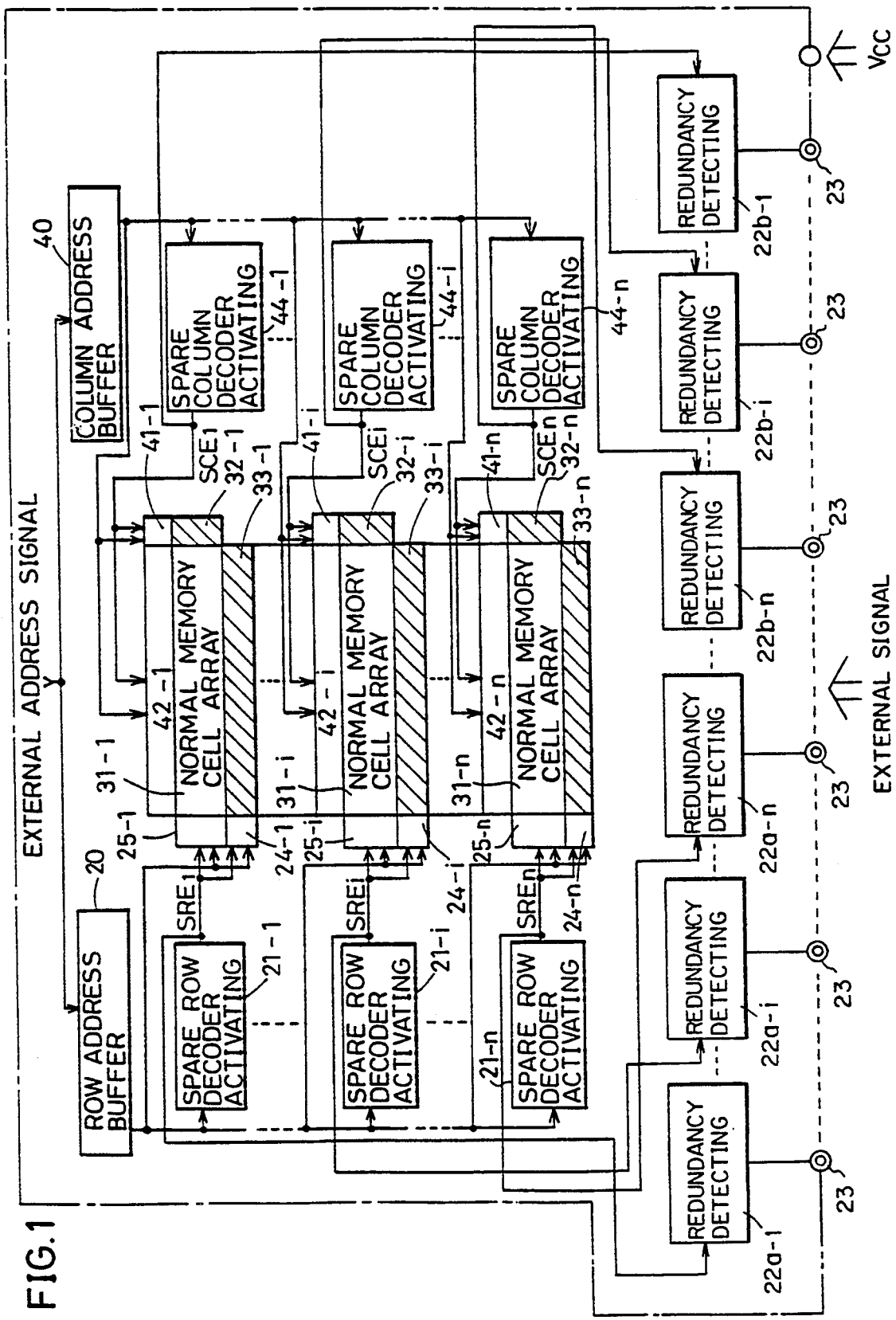
FIG. 1 is a schematic block diagram illustrating the whole configuration of a semiconductor memory device according to an embodiment of the present invention.

FIG. 1 is a schematic block diagram illustrating the whole configuration of a semiconductor memory device according to an embodiment of the present invention. Only structures of main portions of the semiconductor memory device are illustrated in FIG. 1.

Figure 10:
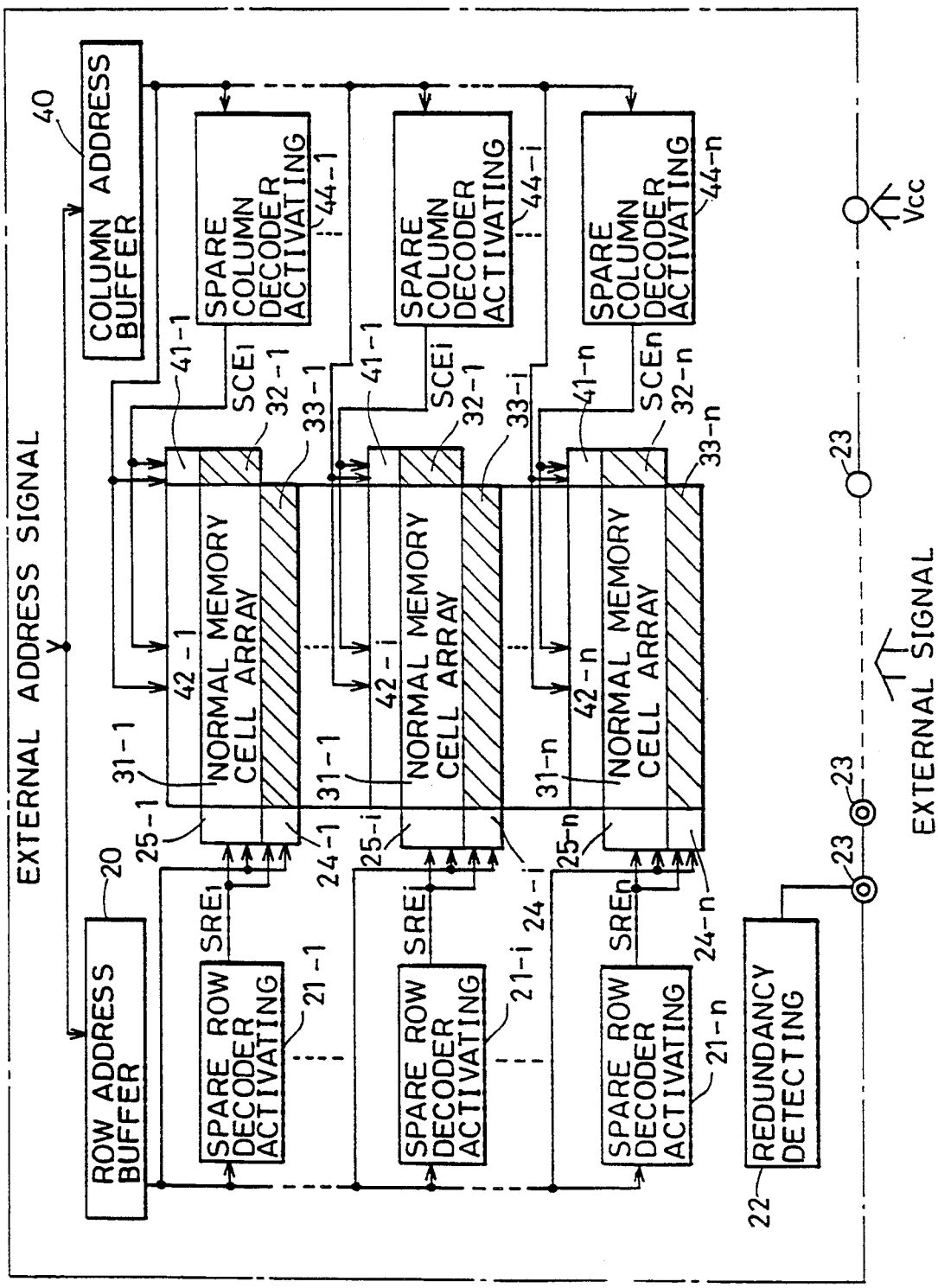
FIG. 10 is a schematic block diagram illustrating the whole configuration of a conventional semiconductor memory device having redundant circuits.
Figure 11:
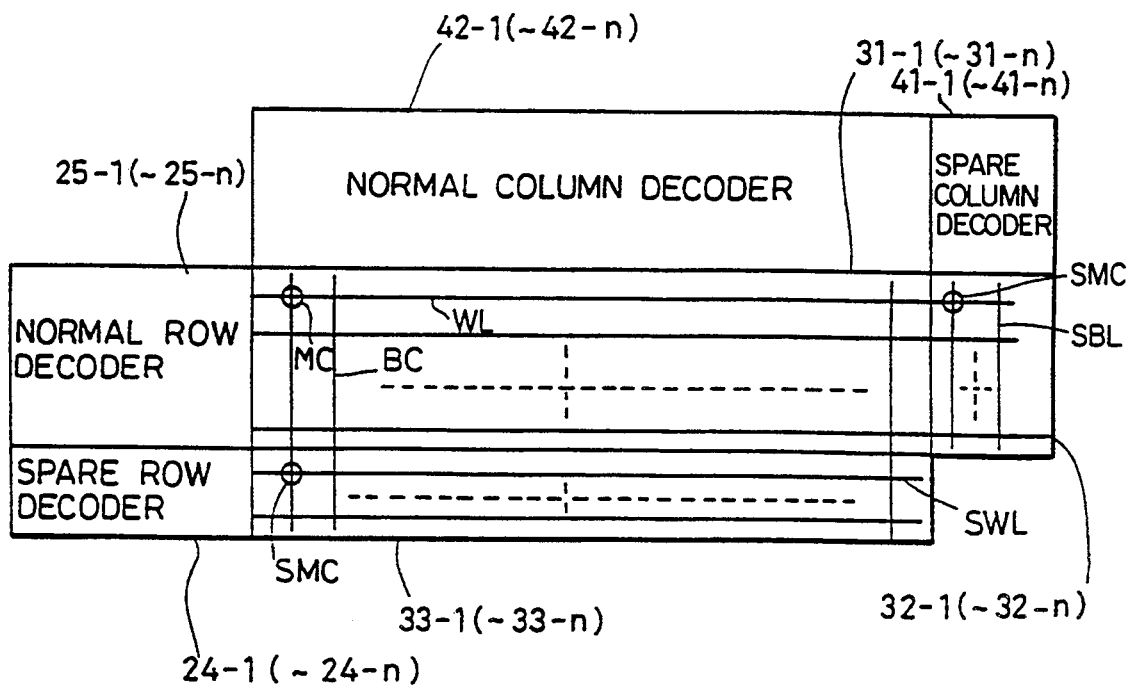
FIG. 11 is a diagram illustrating structures of a normal memory cell array and spare memory cell arrays in FIG. 10.
Figure 12:
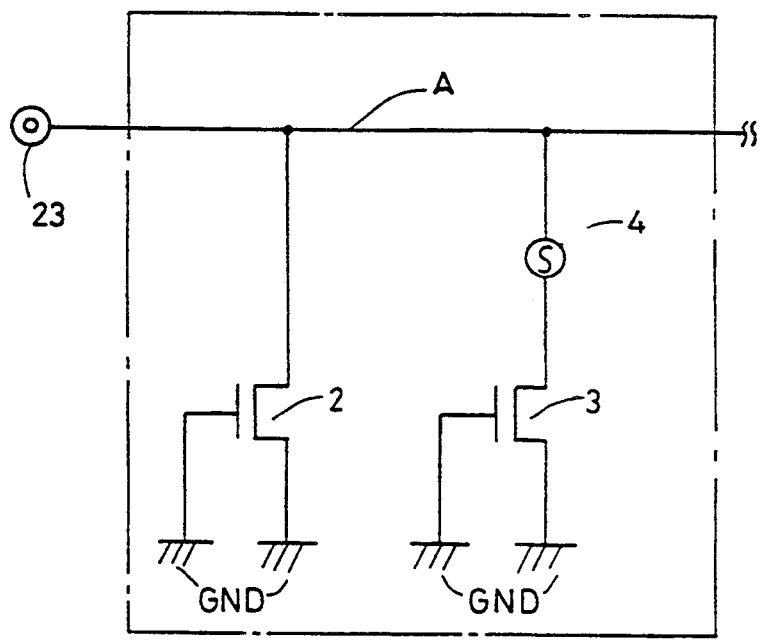
FIG. 12 is a schematic diagram illustrating a structure of a redundancy detecting circuit in FIG. 10.

Referring to FIG. 1, as in the case of the conventional semiconductor memory device illustrated in FIG. 10, the semiconductor memory device includes a plurality of normal memory cell arrays 31-1 to 31-n, two types of spare memory cell arrays 32-1 to 32-n and 33-1 to 33-n provided corresponding to the respective normal memory cell arrays, normal column decoders 42-1 to 42-n and normal row decoders 25-1 to 25-n provided corresponding to the respective normal memory cell arrays, spare column decoders 41-1 to 41-n provided corresponding, respectively, to spare memory cell arrays 32-1 to 32-n, and spare row decoders 24-1 to 24-n provided corresponding, respectively, to spare memory cell arrays 33-1 to 33-n. The semiconductor memory device further includes spare row decoder activating circuits 21-1 to 21-n provided corresponding, respectively, to spare row decoders 24-1 to 24-n, spare column decoder activating circuits 44-1 to 44-n provided corresponding, respectively, to spare column decoders 32-1 to 32-n, a row address buffer 20, and a column address buffer 40.

The configurations and operations of these circuit portions in the semiconductor memory device are the same as those in the conventional semiconductor memory device illustrated in FIG. 10. Specifically, access to a defective memory cell column or a defective memory cell row in normal memory cell arrays 31-1 to 31-n is replaced by access to a spare memory cell column in spare memory cell arrays 32-1 to 32-n or a spare memory cell row in spare memory cell arrays 33-1 to 33-n.

In order to perform this replacement, a fuse (not shown) in each of spare column decoder activating circuits 44-1 to 44-n and each of spare row decoder activating circuits 21-1 to 21-n is selectively cut in a manufacturing process of the semiconductor memory device. A spare column decoder activating circuit in which no fuse is cut always operates so as to deactivate a corresponding one of the spare row decoders while activating a corresponding one of the normal row decoders regardless of a row address signal from row address buffer 20.

The semiconductor memory device further includes redundancy detecting circuits 22a-1 to 22a-n each provided corresponding to one of spare row decoder activating circuits 21-1 to 21-n for detecting whether the fuse in the corresponding spare row decoder activating circuit is cut or not, i.e. whether a corresponding one of the spare memory cell arrays (one of 24-1 to 24-n) corresponding to the spare row decoder activating circuit is used or not and redundancy detecting circuits 22b-1 to 22b-n each provided corresponding to one of spare column decoder activating circuits 44-1 to 44-n for detecting whether the fuse in the corresponding spare column decoder activating circuit is cut or not, i.e. whether one of spare memory cell arrays 32-1 to 32-n corresponding to the spare column decoder activating circuit is used or not.

Unlike the conventional redundancy detecting circuit 22 in FIG. 10, redundancy detecting circuits 22a-1 to 22a-n and 22b-1 to 22b-n receive output signals SRE-1–SREn of corresponding spare row decoder activating circuits 21-1 to 21-n and output signals SCE1–SCEn of corresponding spare column decoder activating circuits 44-1 to 44-n, respectively.

Now, the structures and operations of redundancy detecting circuits 22a-1 to 22a-n, 22b-1 to 22b-n will be described with reference to FIGS. 1 and 2.

In the following description, it is assumed that spare column decoders 41-1 to 41-n are activated in response to output signals SCE1–SCEn at a high level from corresponding spare column decoder activating circuits 44-1 to 44-n, respectively, and spare row decoders 24-1 to 24-n are activated in response to signals SRE1–SREn at the high level from corresponding spare row decoder activating circuits 21-1 to 21-n, respectively. It is further assumed that a spare row decoder activating circuit in which any one of fuses is cut operates so as to provide a signal at the high level in response to a particular row address signal from row address buffer 20, and a spare column decoder activating circuit in which any one of fuses is cut operates so as to provide a signal at the high level in response to a particular column address signal from column address buffer 40.

In addition, it is assumed that normal column decoders 42-1 to 42-n are deactivated in response to signals SCE1-SCEn at the high level from corresponding spare column decoder activating circuits 44-1 to 44-n, respectively, and normal row decoders 25-1 to 25-n are deactivated in response to signals SRE1-SREn at the high level from corresponding spare row decoder activating circuits 21-1 to 21-n, respectively.

Figure 2:
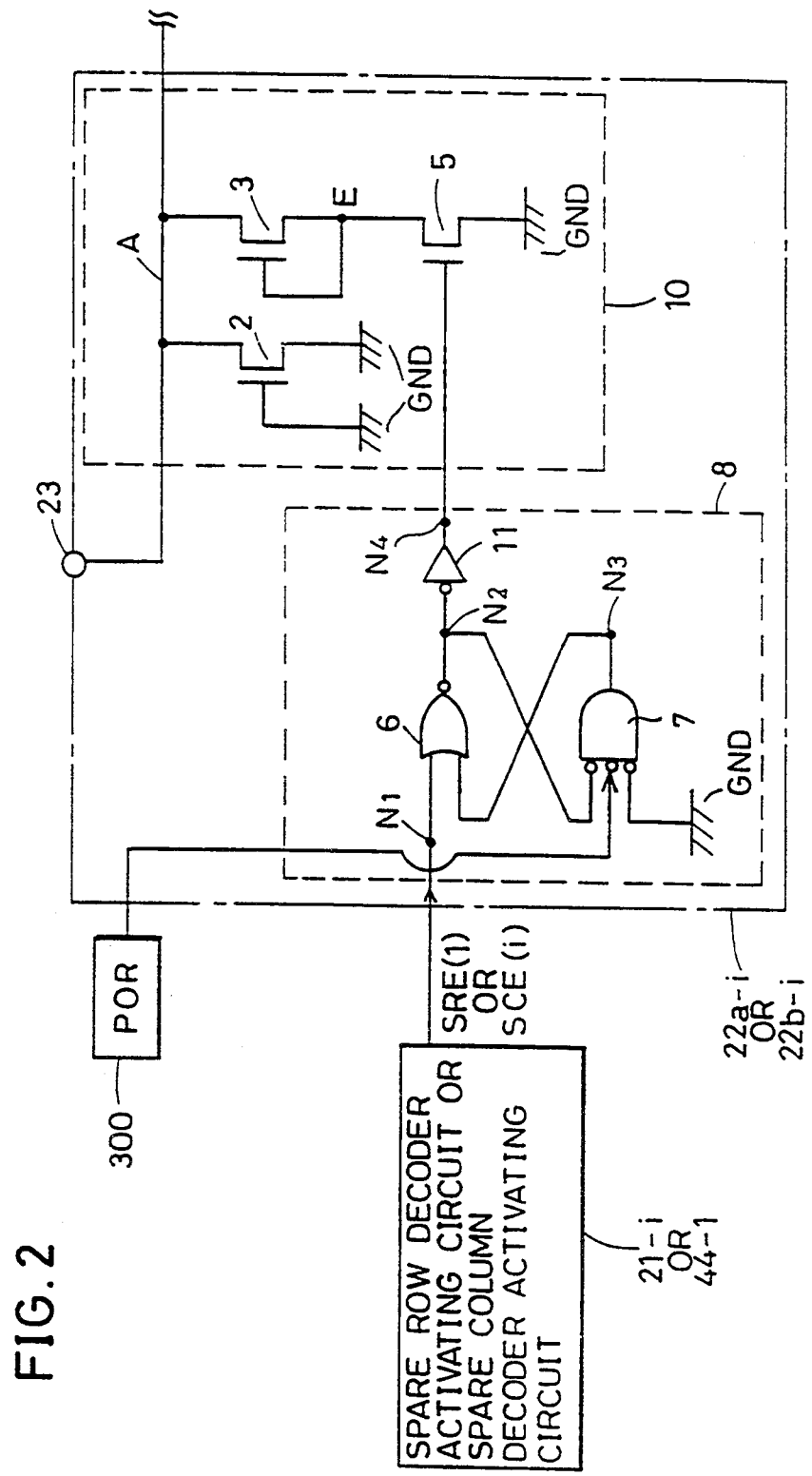
FIG. 2 is a schematic diagram of a circuit illustrating the structure of each of redundancy detecting circuits in FIG. 1.

FIG. 2 is a schematic diagram illustrating a structure of each of redundancy detecting circuits 22a-1 to 22a-n, 22b-1 to 22b-n. FIG. 2 representatively shows a structure of arbitrary one of the redundancy detecting circuits.

Figure 3:
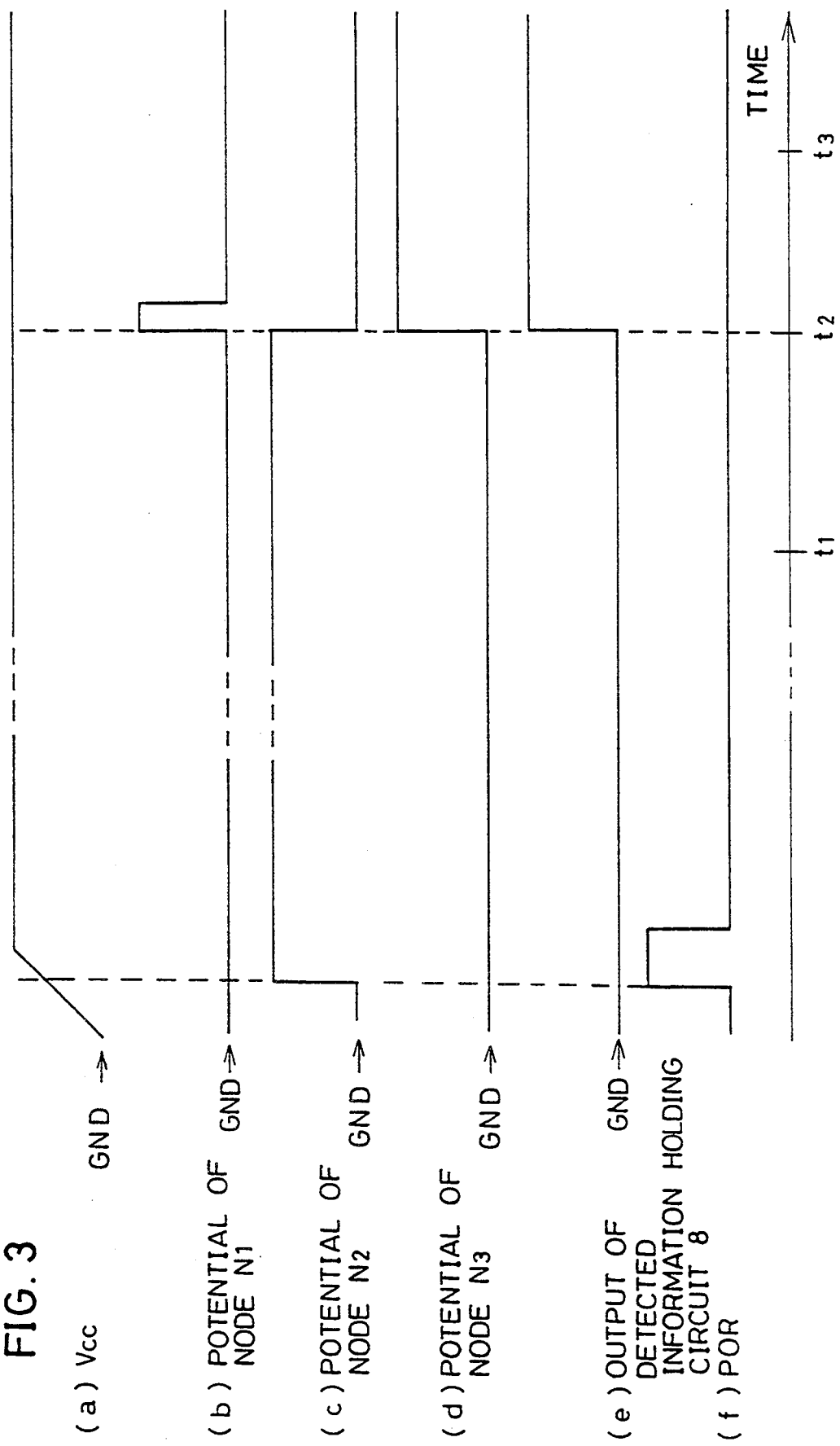
FIGS. 3(a)–(f) are a timing chart for explaining operations of the circuit illustrated in FIG. 2.

FIG. 3 is a timing chart for explaining an operation of the redundancy detecting circuit illustrated in FIG. 2.

Referring to FIG. 2, each of redundancy detecting circuits 22a-1 to 22a-n, 22b-1 to 22b-n includes a detected information holding circuit 8 which receives an output signal (SRE1-SREn) of a corresponding one of spare row decoder activating circuits 21-1 to 21-n or an output signal (SCE1-SCEn) of a corresponding one of spare column decoder activating circuits 44-1 to 44-n and a detected information providing circuit 10 for providing an output signal of detected information holding circuit 8 to the outside.

Detected information holding circuit 8 includes a two-input NOR gate 6 which receives an output signal (SRE1-SREn) of a corresponding one of the spare row decoder activating circuits or an output signal (SCE1-SCEn) of a corresponding one of the spare column decoder activating circuits as an input, an input inversion type three-input AND gate 7, and an inverter 11 which inverts an output signal of NOR gate 6. One input terminal of AND gate 7 is grounded, and another input terminal of it receives an output signal of AND gate 6. Still another input terminal of it receives an output signal of power on reset signal generating circuit 300. NOR gate 6 receives an output signal (SRE1-SREn) of a corresponding one of the spare row decoder activating circuits or an output signal (SCE1-SCEn) of a corresponding one of the spare column decoder activating circuits and an output signal of AND gate 7 as inputs.

NOR gate 6 operates as an inverter which inverts an output signal of AND gate 7 if an output signal (one of SRE1-SREn or one of SCE1-SCEn) of the corresponding activating circuit is at a low level. Specifically, in a period in which the potential of the node N1 is at the low level, the output logic level of NOR gate 6 is determined by the output logic level of AND gate 7.

One input terminal of AND gate 7 always receives a potential at the low level (the ground potential).

An output signal of a power on reset signal generating circuit 300 is applied to an input terminal of AND gate 7.

Power on reset signal generating circuit 300 is conventionally provided in many types of semiconductor integrated circuit devices for initializing the potential of a predetermined node immediately after a switch for power supply is turned on. Power on reset signal generating circuit 300 is not shown in FIGS. 1 and 10 for simplification of the drawings. Power on reset signal generating circuit 300 provides a one shot pulse of the high level or the low level immediately after the switch for the power supply is turned on (see FIG. 3(f)). In this embodiment, it is assumed that the one shot pulse is of high level and the potential of output terminal N3 of AND gate 7 is initialized to the low level by the one shot pulse.

Accordingly, if the switch for the power supply is turned on in this semiconductor memory device, and the supply voltage Vcc (FIG. 3(a)) rises, the potential of a node N3 is fixed at the low level because of a rise the output signal of power on reset signal generating circuit 300 as illustrated in FIG. 3(d). The potential of node N3 is at the low level, so that NOR gate 6 receives the potential of the low level at one input terminal to provide a potential at the high level.

If the potential of node N3 is fixed at the low level, NOR gate 6 continues providing a potential at the high level unless the potential of node N1 is at the high level. Accordingly, the potential (FIG. 3(c)) of node N2 is held at the high level, which is the initial potential, until an output signal (FIG. 3(b)) of the corresponding activating circuit is changed to the high level. Therefore, as illustrated in FIG. 3(e), the output potential of inverter 11 is held at the low level after the rising of the supply voltage Vcc unless the potential of node N1 is at the high level.

If the potential of node N1 is changed to the high level at a time t2 as illustrated in FIG. 3(b), NOR gate 6 provides a signal at the low level regardless of the potential level of node N3. Therefore, as illustrated in FIG. 3(c), the potential of node N2 falls to the low level in response to the rising of the potential of node N1.

If the potential of node N2 is brought to the low level, the three signals applied to AND gate 7 are brought to the low level, so that AND gate 7 provides a signal at the high level. Therefore, as illustrated FIG. 3(d), the potential of node N3 rises to the high level in response to the falling of the potential of node N2.

If the potential of node N3 is brought to the high level, NOR gate 6 provides a potential at the low level regardless of the potential level of node N1. Accordingly, even at an arbitrary time t3 after the potential of node N1 returns to the low level as illustrated in FIG. 3(b), NOR gate 6 continues providing a potential at the low level. Specifically, as illustrated in FIG. 3(c), the potential of node N2 is fixed at the low level after the rising of the potential of node N1.

Therefore, if the potential of node N1 rises once, the output potential of inverter 11 is thereafter fixed at the high level as illustrated in FIG. 3(e).

The potential of node N1 is at the high level only in the period in which the corresponding one of the activating circuits provides a signal at the high level in response to the particular row address signal from row address buffer 20 or the particular column address signal from column address buffer 40.

Specifically, referring to FIG. 1, in a case where any one of memory cell rows in one of nominal memory cell arrays 31-1 to 31-n is defective, a corresponding one of spare row decoder activating circuits 21-1 to 21-n provides a signal (SRE1-SREn) at the high level to activates a corresponding one of spare row decoders 24-1 to 24-n for a predetermined period only in response to a row address signal indicating the defective memory cell row so that a corresponding one of spare memory cell arrays 33-1 to 33-n is used in place of the defective memory cell row.

Similarly, in a case where any one of memory cell columns in one of normal memory cell arrays 31-1 to 31-n is defective, a corresponding one of spare column decoder activating circuits 44-1 to 44-n provides a signal (SCE1-SCEn) at the high level to activate a corresponding one of spare column decoders 41-1 to 41-n for a predetermined period only in response to a column address signal indicating the defective memory cell column so that a corresponding one of spare memory cell arrays 32-1 to 32-n is used in place of the defective memory cell column.

Thus, each of activating circuits 21-1 to 21-n, 44-1 to 44-n is brought to the high level in response to a particular external address signal only in a case where a corresponding one of spare memory cell arrays 32-1 to 32-n, 33-1 to 33-n is used, i.e. in a case where any one of contained fuses is cut in the manufacturing process. Therefore, if external address signals indicating all of the normal memory cell rows and nominal memory cell columns are supplied sequentially to the semiconductor memory device after supplying the supply voltage and prior to carrying out nominal writing and reading of data, the output potential of one of spare column decoder activating circuits 44-1 to 44-n or spare row decoder activating circuits 21-1 to 21-n which is provided corresponding to a spare memory cell array to be used in the nominal writing and reading is brought to the high level at least once.

Therefore, at the time when all the external address signals have been supplied, only the output potential of detected information holding circuit 8 in the redundancy detecting circuit which receives an output signal of one of the spare row decoder activating circuits (one of 21-1 to 21-n) provided corresponding to the spare memory cell array to be used (one of 31-1 to 31-n) and spare row decoder (one of 24-1 to 24-n) out of redundancy detecting circuits 22a-1 to 22a-n is fixed to the high level.

Detected information providing circuit 10 includes a serial connection circuit of an N channel MOS transistor 5 which receives an output signal of a corresponding detected information holding circuit 8 at the gate and an N channel MOS transistor 3 which is diode connected and an N channel MOS transistor 2 connected in parallel with the serial connection circuit. Both of the serial connection circuit and transistor 2 are provided between ground GND and one of external terminals 23 in FIG. 1. The gate of transistor 2 is grounded.

As in the conventional case, external terminal 23 connected to the redundancy detecting circuit is originally provided for transmitting a signal between the other circuit portions and the outside, and a negative voltage having a predetermined absolute value is externally supplied thereto only in a case where whether the redundant circuits are used or not is tested.

Figure 4:
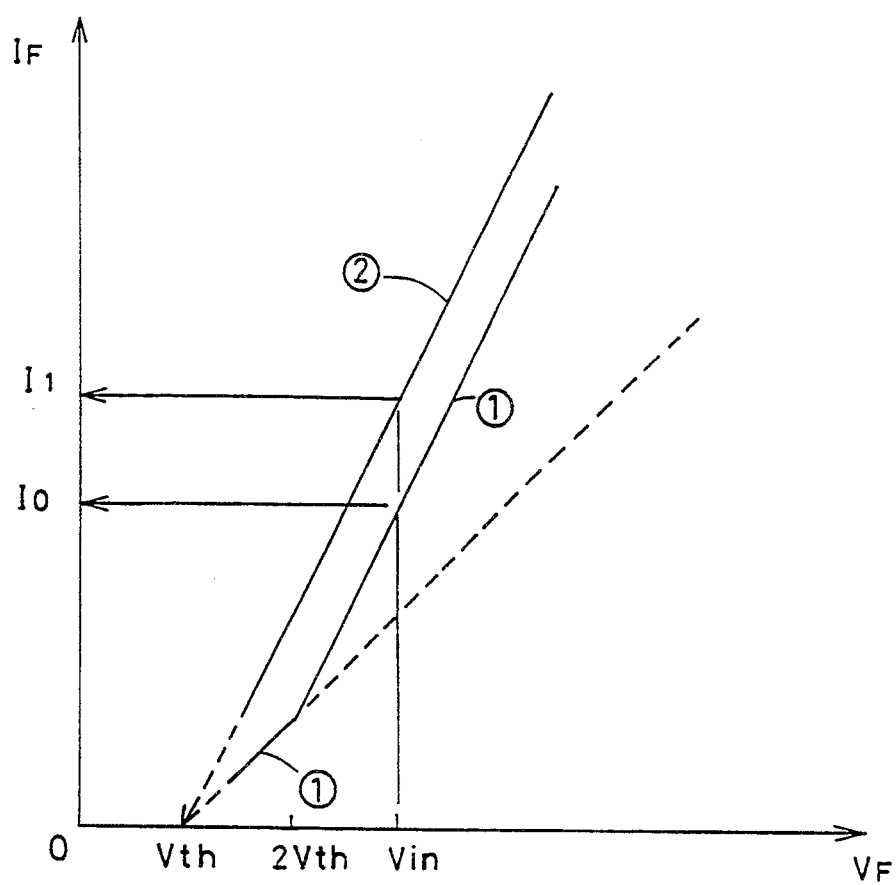
FIG. 4 is a graph showing characteristics of a detected information providing circuit in FIG. 2.

The operation of detected information providing circuit 10 in a case where a negative voltage is applied to external terminal 23 with its absolute value $V_F$ increased gradually will be described with reference to FIG. 4. FIG. 4 is a graph showing the relation between the magnitude $I_F$ of the current flowing in interconnection A in FIG. 2 and the absolute value $V_F$ of the negative voltage applied to external terminal 23 in FIG. 2.

First, an operation of detected information providing circuit 10 in a case where the output potential of detected information holding circuit 8 is at the low level will be described.

If a negative voltage is applied to external terminal 23 with its absolute value $V_F$ increased gradually, all of transistors 2, 3 and 5 are in OFF state, so that no current flows in the interconnection A until the absolute value $V_F$ reaches respective threshold voltages Vth of transistors 2, 3 and 5.

However, if the absolute value $V_F$ reaches the threshold voltage Vth, transistor 2 is brought t0 ON state, so that the current flowing from ground GND through transistors 2 to external terminal 23 is thereafter increased at a constant rate as the absolute value $V_F$ is increased, as shown by solid line 1 in FIG. 4.

Then, if the absolute value $V_F$ reaches the sum of the threshold voltage of transistor 3 and the threshold voltage of transistor 5, i.e. 2Vth, transistors 3 and 5 are also brought to ON state, so that, thereafter, current of a magnitude corresponding to the sum of the current flowing between the source and drain of transistor 2 and the current flowing in the serial connection circuit of transistors 3 and 5 flows in the interconnection A in the direction of from ground GND to ward external terminal 23. Therefore, in the range wherein the absolute value $V_F$ is equal to or higher than the above described sum 2Vth of the threshold voltages, the current flowing in the interconnection A is increased at a rate higher than ever as the absolute value $V_F$ is increased as shown by solid line 1 in FIG. 4.

Now, an operation of detected information providing circuit 10 in a case where the output potential of detected information holding circuit 8 is at the high level will be described. In this case, transistor 5 is in ON state regardless of the potential of external terminal 23. Accordingly, if a negative voltage is applied to external terminal 23 with its absolute value $V_F$ increased gradually, transistors 2 and 3 are both in OFF state so that no current flows in the interconnection A until the absolute value $V_F$ reaches respective threshold voltages Vth of transistors 2 and 3.

However, if the absolute value $V_F$ reaches the threshold voltage Vth, transistors 2 and 3 are both brought to ON state, so that current of a magnitude corresponding to the sum of the current between the source and drain of transistor 2 and the current flowing in the serial connection circuit of transistors 3 and 5 starts to flow in the interconnection A in the direction of from ground GND to external terminal 23. This current is thereafter increased at a constant rate as the absolute value $V_F$ is increased as shown by solid line 2 in FIG. 4.

Thus, the current flowing in the interconnection A in the range wherein the absolute value $V_F$ of the voltage applied to external terminal 23 is equal to or lower than the sum (2Vth) of the threshold voltages of two MOS transistors is supplied only from transistor 2 in a case where the output potential of detected information holding circuit 8 is at the low level, and it is supplied not only from transistor 2 but also from the serial connection circuit of transistors 3 and 5 in a case where the output potential of detected information holding circuit 8 is at the high level.

Accordingly, the magnitude of the current flowing to external terminal 23 when a negative voltage having a predetermined absolute value Vin equal to or higher than the sum (2Vth) of the threshold voltage of transistor 3 and the threshold voltage of transistor 5 is applied to external terminal 23 in a case where the output potential of the corresponding detected information holding circuit 8 is at the high level ($I_1$) differs from that in a case where it is at the low level ($I_0$).

Then, referring to FIG. 1, if the magnitude $I_0$ of the current flowing to external terminal 23 when the output potential of detected information holding circuit 8 in each of redundancy detecting circuits 22a-1 to 22a-n, 22b-1 to 22b-n is at the low level, and a negative voltage having an absolute value Vin is applied to external terminal 23 connected to the redundancy detecting circuit is used as a reference value, it is possible to determine whether or not each of spare memory cell arrays 32-1 to 32-n, 33-1 to 33-n is used.

Specifically, external address signals indicating all the memory cell rows and all the memory cell columns are supplied sequentially to the semiconductor memory device, and then the current flowing in each of external terminals 23 is measured with a tester or the like with a negative voltage having an absolute value Vin being supplied to external terminals 23 connected, respectively, to redundancy detecting circuits 22a-1 to 22a-n, 22b-1 to 22b-n, and the measured value and the reference value are compared. If the value measured from certain external terminal 23 is larger than the reference value $I_0$, the output potential of detected information holding circuit 8 in the redundancy detecting circuit connected to that external terminal is considered to be at the high level, so that it is possible to determine that the spare memory cell array corresponding to the redundancy detecting circuit is not used. Conversely, if the measured value is equal to the reference value $I_0$, the output potential of detected information holding circuit 8 is considered to be at the low level, so that it is possible to determine that the spare memory cell array provided corresponding to that redundancy detecting circuit is not used.

In order to obtain this reference value, the same negative voltage as the one to be supplied to each external terminal 23 for testing to see whether the redundant circuit is used or not is applied to each external terminal 23, and the current flowing in external terminal 23 is measured with a tester or the like at the time (time t1 in FIG. 3) when no external address signal is applied to the semiconductor memory device.

At time t1 in FIG. 3, the output potential of detected information holding circuit 8 in each of redundancy detecting circuits 22a-1 to 22a-n, 22b-1 to 22b-n is fixed at the low level, so that the value of $I_0$ in FIG. 4 is obtained from each external terminal 23 by carrying out such measurement.

As described above, according to this embodiment, whether the redundant circuits are used or not is detected on the basis of output signals of the spare row decoder activating circuits and the spare column decoder activating circuits which are brought to a predetermined logic level (the high level) only in cases where the redundant circuits are used, so that it is unnecessary to provide the step of selectively cutting fuses in the redundancy detecting circuits according to whether the redundant circuits are used or not in a manufacturing process of the semiconductor memory device as in the conventional case.

Furthermore, output signals of the spare row decoder activating circuits and the spare column decoder activating circuits are not brought to the predetermined logic level unless a particular row address signal and a particular column address signal are externally supplied. Therefore, if a period in which no external address signal is supplied to the semiconductor memory device is utilized, it is possible to measure a reference value for determining whether each of spare memory cell arrays 32-1 to 32-n, 33-1 to 33-n is used or not from each of external terminals 23 connected to redundancy detecting circuits 22a-1 to 22a-n, 22b-1 to 22b-n provided for detecting whether that spare memory cell array is used or not. Accordingly, unlike the conventional case, it is possible to correctly measure a reference value for determining whether a redundant circuit is used or not, so that it is also possible to determine whether the redundant circuit is used or not more correctly as compared with the conventional case.

Now, in the above embodiment, one redundancy detecting circuit is provided for each spare row decoder activating circuit and each spare column decoder activating circuit in order to individually determine whether each spare memory cell array is used or not, and each redundancy detecting circuit is connected to an external terminal different from external terminals to which the other redundancy detecting circuits are connected. However, referring to FIG. 1, in a case where it is only desired to test to see which type of spare memory cell array out of the two types of space memory cell arrays (32-1 to 32-n and 33-1 to 33-n) provided corresponding to each of normal memory cell arrays 31-1 to 31-n is used, one redundancy detecting circuit may be provided corresponding to all the spare row decoder activating circuits 21-1 to 21-n, and one redundancy detecting circuit may be provided corresponding to all the spare column decoder activating circuits 44-1 to 44-n.

Figure 5:
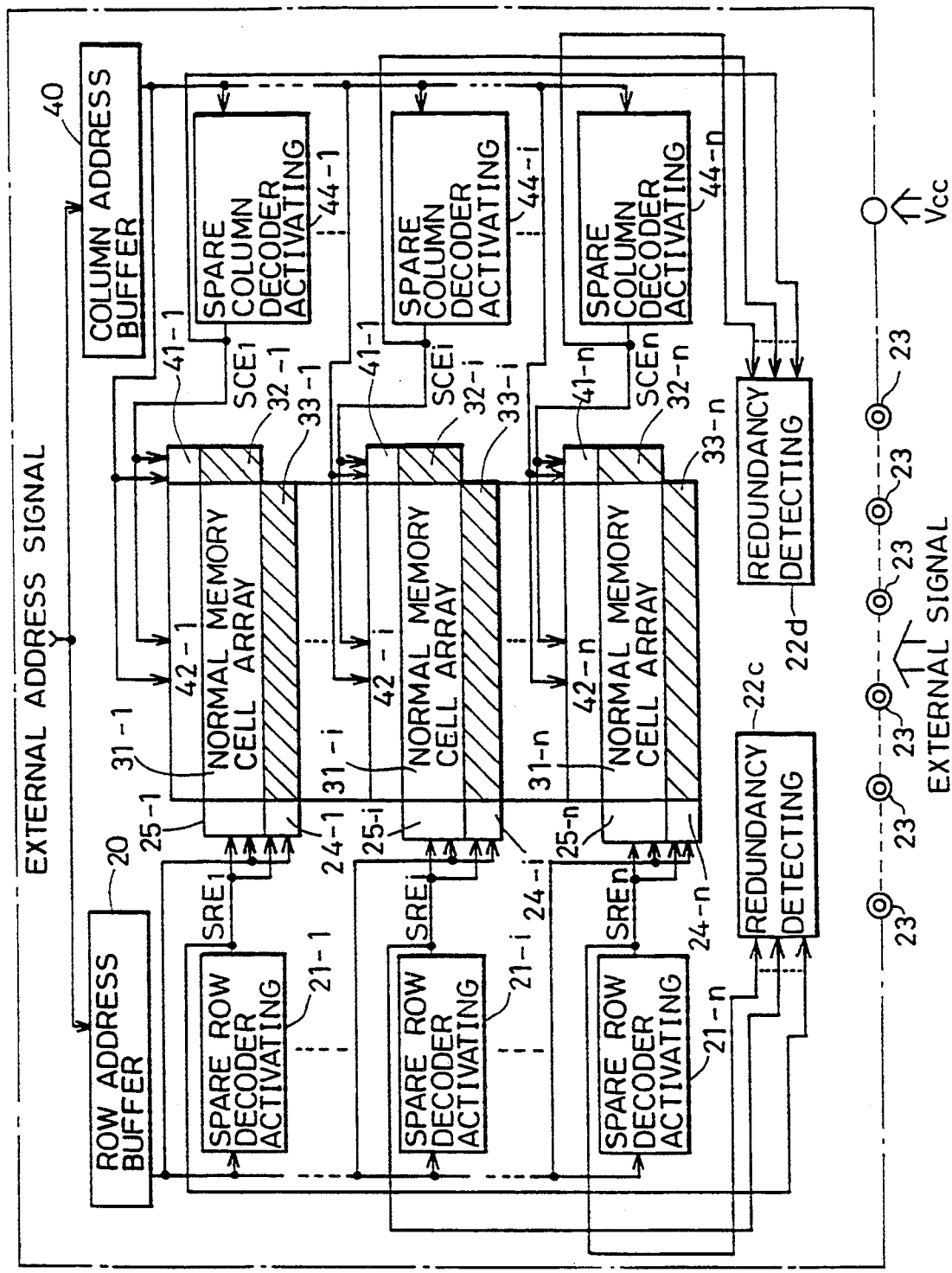
FIG. 5 is a schematic block diagram illustrating the whole configuration of a semiconductor memory device according to another embodiment of the present invention.
Figure 6:
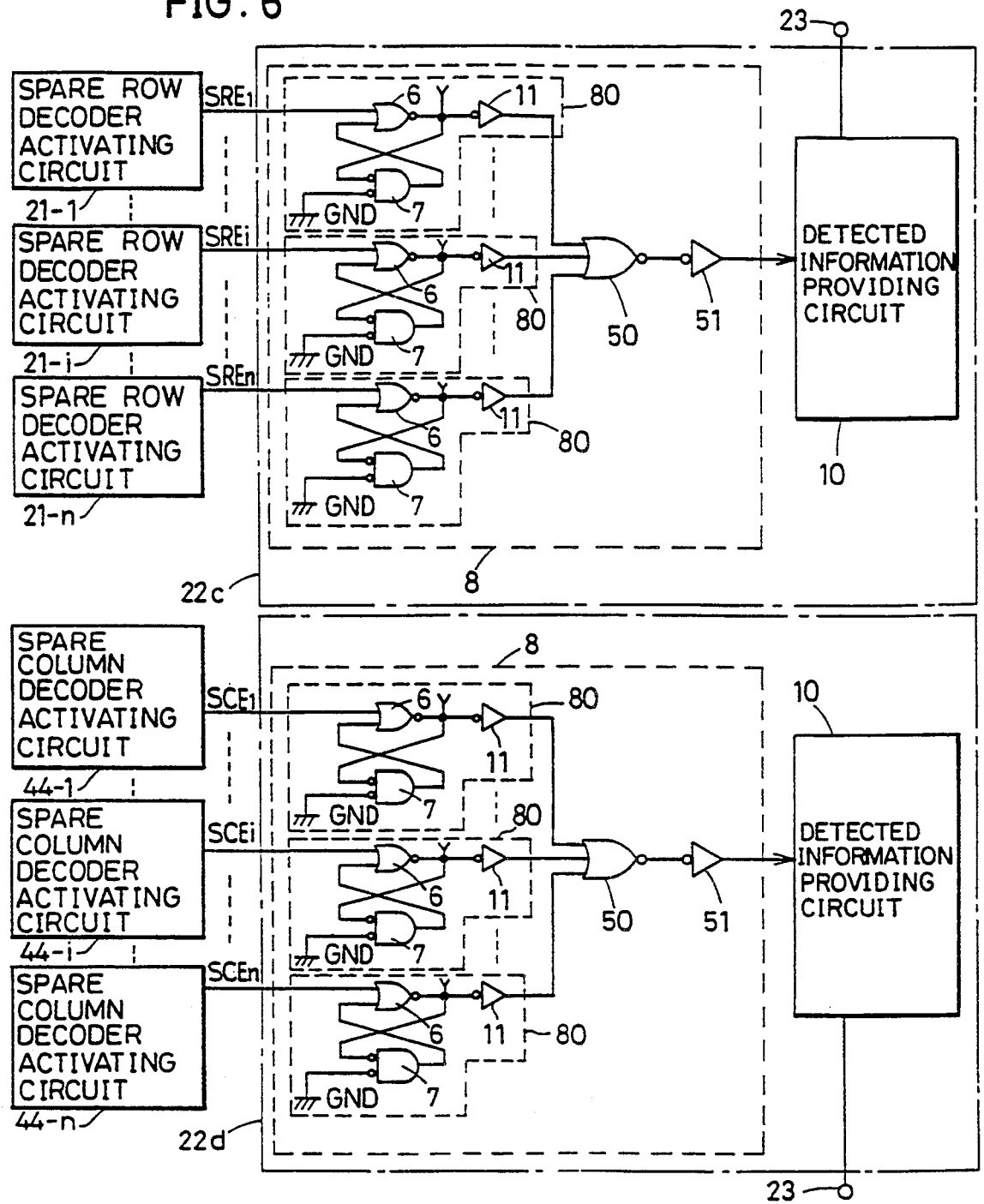
FIG. 6 is a schematic diagram illustrating structures of redundancy detecting circuits in FIG. 5.

FIG. 5 is a schematic block diagram illustrating the whole configuration of a semiconductor memory device in such a case, which illustrates another embodiment of the present invention. FIG. 6 is a schematic diagram illustrating structures of redundancy detecting circuits 22c and 22d in FIG. 5.

Referring to FIG. 6, redundancy detecting circuit 22c includes a detected information holding circuit 8, which has holding circuit blocks 80 provided corresponding, respectively, to spare row decoder activating circuits 21-1 to 21-n, a NOR gate 50 receiving output signals of all the holding circuit blocks 80, and an inverter 51 inverting an output signal NOR gate 50, and a detected information providing circuit 10.

Similarly, redundancy detecting circuit 22d includes a detected information holding circuit 8, which has holding circuit blocks 80 provided corresponding, respectively, to spare column decoder activating circuits 44-1 to 44-n, a NOR gate 50 receiving outputs of all the holding circuit blocks 80, and an inverter 51 inverting an output signal of NOR gate 50, and a detected information providing circuit 10.

Each holding circuit block 80 has the same structure as that of detected information holding circuit 8 in FIG. 2. Accordingly, at the time when all external address signals have been applied sequentially to the semiconductor memory device, only the output potential of holding circuit block 80 provided corresponding to one of the spare row decoder activating circuits (one of 21-1 to 21-n) or one of the spare column decoder activating circuits (one of 44-1 to 44-n) corresponding to the spare memory cell array to be used is fixed to the high level.

In each of redundancy detecting circuits 22c, 22d, if the output potential of at least one of holding circuit blocks 80 is at the high level, NOR gate 50 provides a potential at the low level. Therefore, the output potential of inverter 51 applies a potential at the high level to detected information providing circuit 10 when the output potential of at least one of holding circuit blocks 50 is at the high level.

Each detected information providing circuit 10 according to this embodiment has the same structure as that of detected information providing circuit 10 in FIG. 2.

Therefore, if application of all external address signals to this semiconductor memory device is completed, only detected information providing circuit 10 in one of the redundancy detecting circuits (one of 22c and 22d) provided corresponding to the used spare memory cell array out of the two types of spare memory cell arrays (32-1 to 32-n and 33-1 to 33-n) shows the characteristic shown by solid line 2 in FIG. 4. Accordingly, in FIG. 5, if the current is measured from external terminals 23 to which redundancy detecting circuits 22c and 22d are connected, respectively, in the same way as in the case of the former embodiment, it is possible to determine which of the two types of spare memory cell arrays is used.

Figure 7:
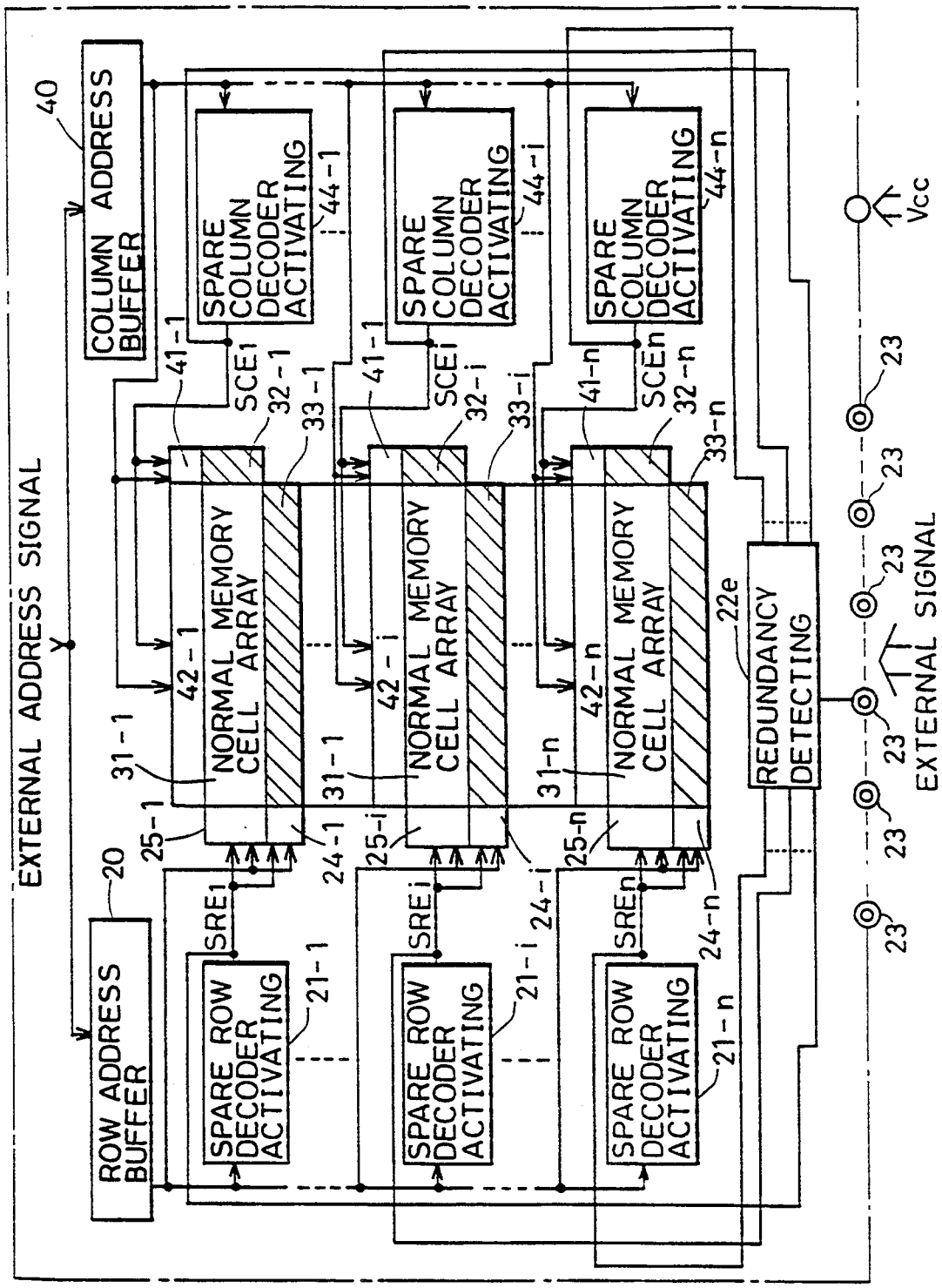
FIG. 7 is a schematic block diagram illustrating the whole configuration of a semiconductor memory device according to still another embodiment of the present invention.

In addition, if only the information of whether any of spare memory cell arrays 32-1 to 32-n, 33-1 to 33-n is used or not is necessary, one redundancy detecting circuit may be provided, in common, to all spare row decoder activating circuits 21-1 to 21-n and all spare column decoder activating circuits 44-1 to 44-n. FIG. 7 is a schematic block diagram illustrating the whole configuration of a semiconductor memory device in such a case, which illustrates still another embodiment of the present invention.

Figure 8:
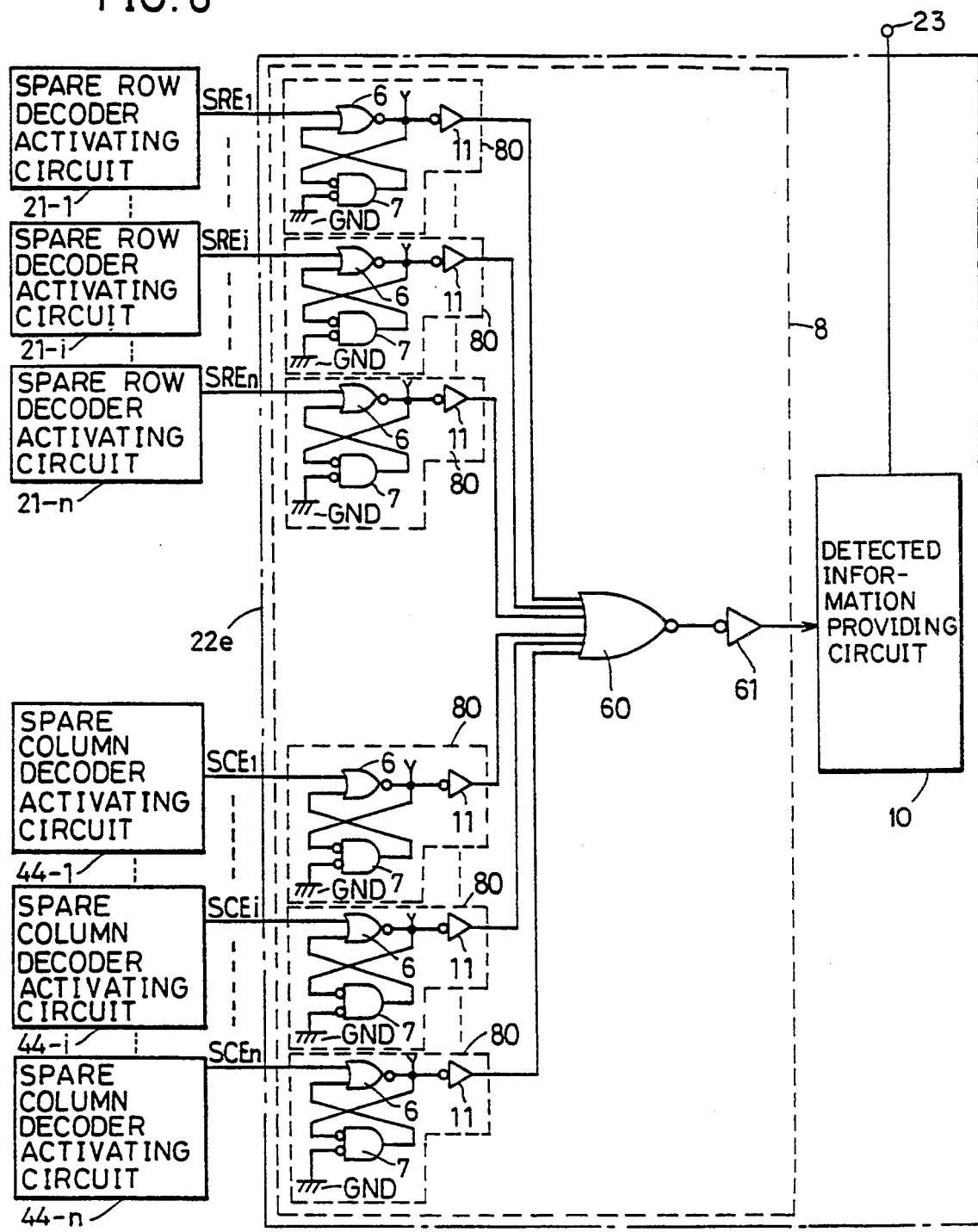
FIG. 8 is a schematic diagram illustrating a structure of a redundancy detecting circuit in FIG. 7.

FIG. 8 is a schematic diagram illustrating a structure of redundancy detecting circuit 22e in FIG. 7. Referring to FIG. 8, redundancy detecting circuit 22e includes a detected information holding circuit 8, which has holding circuit blocks 80 provided corresponding to respective spare row decoder activating circuits 21-1 to 21-n and respective spare column decoder activating circuits 44-1 to 44-n, a NOR gate 60 receiving output signals of all the holding circuit blocks 80, and an inverter 61 inverting an output signal of NOR gate 60, and a detected information providing circuit 10.

Each holding circuit block 80 has the same structure as that of detected information holding circuit 8 in FIG. 2 in this embodiment. Accordingly, at the time when application of all external signals to this semiconductor memory device is completed, the output potential of inverter 61 is fixed at the high level by the output potential of holding circuit block 80 provided corresponding to a used spare memory cell array, and the characteristic of detected information providing circuit 10 is set to the one shown by solid line 2 in FIG. 4 only in a case where there is a spare memory cell array which is used.

Therefore, in FIG. 7, it is possible to determine whether any of the spare memory cell arrays in the semiconductor memory device is used or not by detecting the current from external terminal 23 connected to redundancy detecting circuit 22e in the same way as in the cases of the above two embodiments.

In all the above embodiments, a detected information providing circuit in a redundancy detecting circuit is constructed so that the magnitude of current flowing in an external terminal connected thereto differs according to whether a redundant circuit is used or not. However, the structure of a detected information providing circuit is not limited to such a structure.

Figure 9:
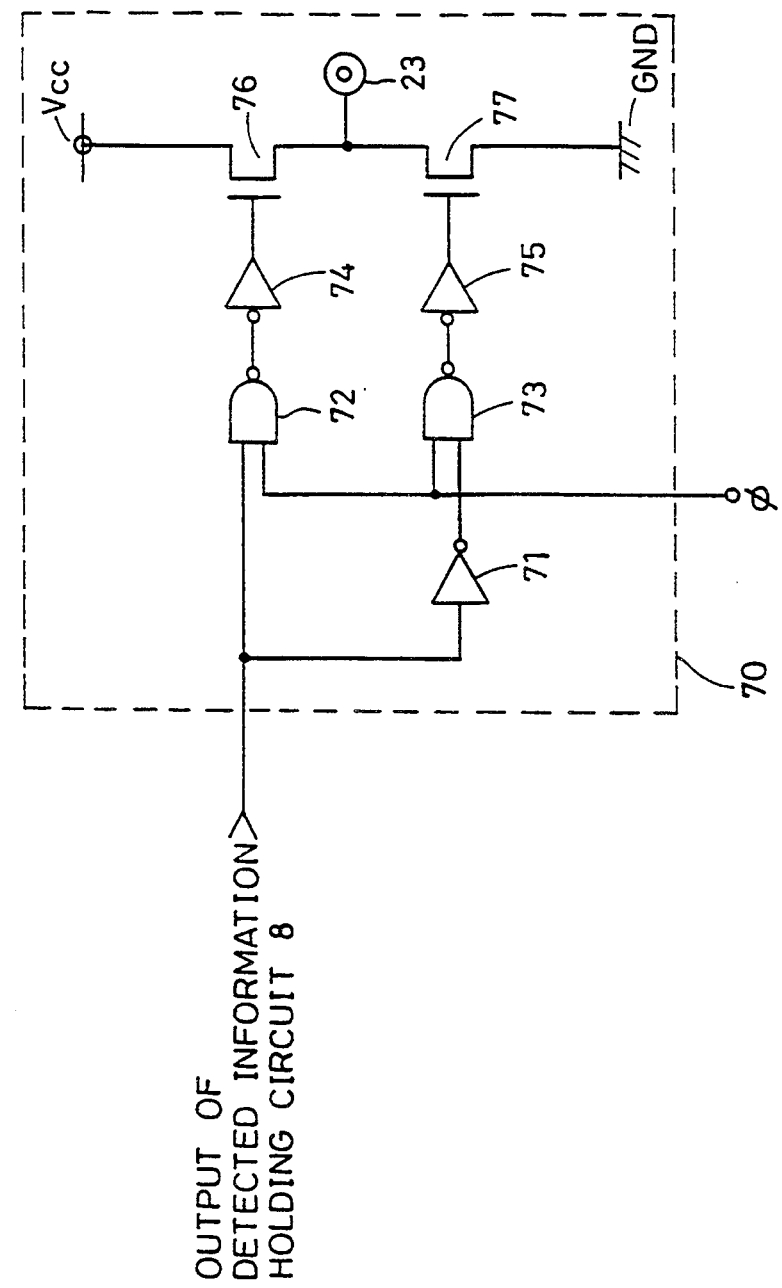
FIG. 9 is a schematic diagram illustrating a structure of a detected information providing circuit in a redundancy detecting circuit according to a further embodiment of the present invention.

FIG. 9 is a schematic diagram of a detected information providing circuit constructed so that the potential level appearing onto an external terminal differs according to whether a redundant circuit is used or not, which illustrates a further embodiment of the present invention.

Referring to FIG. 9, a detected information providing circuit 70 includes a two-input NAND gate 72 receiving an output signal of a corresponding detected information holding circuit (not shown) and a predetermined clock signal $\phi$, an inverter 71 inverting an output signal of the corresponding detected information holding circuit, a two-input NAND gate 73 receiving an output signal of inverter 71 and the above predetermined clock signal $\phi$ as inputs, inverters 74 and 75 inverting output signals of NAND gates 72 and 73, respectively, and N channel MOS transistors 76 and 77 receiving output signals of inverters 74 and 75 at the gates, respectively.

Transistors 76 and 77 are coupled in series with each other between a supply voltage Vcc and ground GND, and a connection point of transistors 76 and 77 is connected to a predetermined external terminal 23.

The clock signal $\phi$ is a control signal, which is brought to the high level only in a case where whether a redundant circuit is used or not is tested and which is brought to the low level in the other period, and it may be supplied directly from the outside or generated in the semiconductor memory device.

If the clock signal $\phi$ is at the high level, the output potentials of NAND gates 72 and 73 are brought to the low level and the high level, respectively, in a case where the output potential of the corresponding detected information holding circuit is at the high level, and they are brought to the low level and the high level, respectively, when the output potential of the corresponding detected information holding circuit is at the low level.

Accordingly, if any one of the spare memory cell arrays corresponding to the redundancy detecting circuit including the detected information providing circuit 70 is used, transistor 76 receives a potential at the high level from inverter 74 and is brought to ON state, so that supply potential Vcc appears onto external terminal 23. However, if none of the spare memory cell arrays corresponding to the redundancy detecting circuit are used, transistor 77 receives a potential at the high level from inverter 75 and is brought to ON state, so that the ground potential appears onto external terminal 23.

Specifically, if this detected information providing circuit 70 is used in place of detected information providing circuit 10 in FIGS. 2, 6 and 8, it is possible to determine whether a spare memory cell array corresponding to a redundancy detecting circuit connected to an external terminal 23 is used or not by detecting the potential of external terminal 23 with the clock signal $\phi$ being at the high level after external address signals indicating all normal memory cell rows and all normal memory cell columns have been applied to the semiconductor memory device.

In a period in which the clock signal $\phi$ is at the low level, output potentials of NAND gates 72 and 73 are both fixed at the high level regardless of the output potential level of the corresponding detected information holding circuit. Accordingly, the output potentials of inverters 74 and 75 are both fixed to the low level, and, as a result, transistors 76 and 77 are both brought to the OFF state. Specifically, in the period in which the clock signal $\phi$ is at the low level, external terminal 23 is electrically separated from the corresponding redundancy detecting circuit.

Thus, according to this embodiment, a potential appearing onto a predetermined external terminal differs according to whether a redundant circuit is used or not, so that it is unnecessary to measure a reference value as in the case of the former embodiments.

In addition, it is also unnecessary to set the whole semiconductor memory device to a special mode by supplying an external signal having a level or changing timing different from the normal ones, for example, in order to test to see whether a redundant circuit is used or not, so that it is possible to carry out such a test easily.

In addition, the present invention is also applicable to a semiconductor memory device having only one type of spare memory cell array, i.e. a semiconductor memory device having only one of a spare row decoder activating circuit and a spare column decoder activating circuit.

The present invention is specially effective when applied to a DRAM (Dynamic Random Access Memory), for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a normal memory cell array having a plurality of normal memory cells;
   a spare memory cell array having spare memory cells each being capable of replacing any one of said plurality of normal memory cells;
   normal selection means for selecting any one of said plurality of normal memory cells for writing and reading data;
   spare selection means for selecting one of said spare memory cells in place of any one of said plurality of normal memory cells;
   control signal providing means for providing a control signal which activate said spare selection means and deactivates said normal selection means to use said spare memory cell array; and
   electric circuit means which is set to provide a particular electric signal to a predetermined external terminal in response to said control signal,
   wherein said electric circuit means comprises means for supplying said external terminal with said particular electric signal continuously after selecting one of said spare memory cells during writing and reading data.

2. The semiconductor memory device according to claim 1, wherein said electric circuit means includes:
   means responsive to said control signal for holding a signal at a predetermined logic level; and
   means responsive to said signal at the predetermined logic level held by said holding means for providing said particular electric signal to said predetermined external terminal.

3. The semiconductor memory device according to claim 2, wherein said providing means includes: current generating means responsive to application of a predetermined potential to said predetermined external terminal for generating current which flows between said predetermined external terminal and said providing means; and
   current increasing means responsive to said signal at the predetermined logic level held by said holding means for increasing said current.

4. A semiconductor memory device, comprising:
   a normal memory cell array having a plurality of normal memory cells;
   a spare memory cell array having spare memory cells each being capable of replacing any one of said plurality of normal memory cells;
   normal selection means for selecting any one of said plurality of normal memory cells for writing and reading data;
   spare selection means for selecting one of said spare memory cells in place of any one of said plurality of normal memory cells;
   control signal providing means for providing a control signal which activates said spare selection means and deactivates said normal selection means to use said spare memory cell array; and
   electric circuit means which is set to provide a particular electric signal to a predetermined external terminal in response to said control signal,
   said electric circuit means including
   means responsive to said control signal for holding a signal at a predetermined logic level; and
   means responsive to said signal at the predetermined logic level held by said holding means for providing said particular electric signal to said predetermined external terminal,
   said providing means including:
   current generating means responsive to application of a predetermined potential to said predetermined external terminal for generating current which flows between said predetermined external terminal and said providing means; and
   current increasing means responsive to said signal at the predetermined logic level held by said holding means for increasing said current;
   wherein said current generating means includes first electric path forming means responsive to the application of said predetermined potential to said predetermined external terminal for forming a first electric path between said predetermined external terminal and a predetermined potential source, and said current increasing means includes second electric path forming means responsive to said signal at the predetermined logic level held in said holding means and the application of said predetermined potential to said predetermined external terminal for forming a second electric path between said predetermined external terminal and said predetermined potential source.

5. The semiconductor memory device according to claim 4, wherein said first electric path forming means includes a first field effect semiconductor element having a first conduction terminal connected to said predetermined external terminal, a second conduction terminal connected to said predetermined potential source, and a control terminal connected to said predetermined potential source.

6. The semiconductor memory device according to claim 4, wherein said second electric path forming means includes:
   a second field effect semiconductor element having a first conduction terminal connected to said predetermined external terminal, a second conduction terminal, and a control terminal connected to said second conduction terminal; and
   a third field effect semiconductor element having a first conduction terminal connected to said second conduction terminal of said second field effect semiconductor element, a second conduction terminal connected to said predetermined potential source, and a control terminal for receiving said signal held in said holding means.

7. The semiconductor memory device according to claim 5, wherein the polarity of said predetermined potential is negative, the potential of said predetermined potential source is a ground potential, and the polarity of said first field effect semiconductor element is N type.

8. The semiconductor memory device according to claim 6, wherein the polarity of said predetermined potential is negative, the potential of said predetermined potential source is a ground potential, said predetermined logic level is a high level, and the polarity of each of said second and third field effect semiconductor elements is N type.

9. The semiconductor memory device according to claim 2, wherein said providing means includes application potential switching means for applying a potential at a first logic level to said predetermined external terminal when a signal held in said holding means is a signal at said predetermined logic level and applying a potential at a second logic level to said predetermined external terminal when said held signal is a signal at another logic level.

10. The semiconductor memory device according to claim 9, wherein said application potential switching means includes first switching means coupled between a potential at said first logic level and said predetermined external terminal, second switching means coupled between a potential at said second logic level and said predetermined external terminal, and control means responsive to said signal held in said holding means for controlling said first and second switching means.

11. The semiconductor memory device according to claim 10, wherein said control means is responsive to said signal at the predetermined logic level held in said holding means for turning on said first switching means and turning off said second switching means.

12. The semiconductor memory device according to claim 11, wherein said control means is activated in response to a predetermined activating signal.

13. The semiconductor memory device according to claim 12, wherein said control means includes: first logical circuit means for forming a logical product signal of said signal held in said holding means and said predetermined activating signal;
inverter means for inverting said signal held in said holding means; and
second logical circuit means for forming a logical product signal of said signal inverted by said inverter means and said predetermined activating signal,
wherein said first switching means is controlled by said signal formed by said first logical circuit means, and said second switching means is controlled by said signal formed by said second logical circuit means.

14. The semiconductor memory device according to claim 13, wherein said first switching means includes a first field effect semiconductor element, which has a first conduction terminal for receiving a potential at said first logic level, a second conduction terminal connected to said predetermined external terminal, and a control terminal receiving said signal formed by said first logical circuit means, and said second switching means includes a second field effect semiconductor element, which has a first conduction terminal for receiving a potential at said second logic level, a second conduction terminal connected to said predetermined external terminal, and a control terminal for receiving said signal formed by said second logical circuit means.

15. The semiconductor memory device according to claim 14, wherein said first logic level is a high level, said second logic level is a low level, said predetermined logic level is the high level, and the polarity of each of said first and second field effect semiconductor element is N type.

16. The semiconductor memory device according to claim 13, wherein each of said first and second logical circuit means includes a two-input NAND gate and an inverter for inverting an output signal of said NAND gate.

17. A semiconductor memory device, comprising:
a normal memory cell array having a plurality of normal memory cells;
a spare memory cell array having spare memory cells each being capable of replacing any one of said plurality of normal memory cells;
normal selection means for selecting any one of said plurality of normal memory cells for writing and reading data;
spare selection means for selecting one of said spare memory cells in place of any one of said plurality of normal memory cells;
control signal providing means for providing a control signal which activates said spare selection means and deactivates said normal selection means to use said spare memory cell array; and
electric current means which is set to provide a particular electric signal to a predetermined external terminal in response to said control signal,
said electric circuit means including
means responsive to said control signal for holding a signal at a predetermined logic level; and
means responsive to said signal at the predetermined logic level held by said holding means for providing said particular electric signal to said predetermined external terminal;
wherein said holding means includes a first node for receiving an output signal of said control signal providing means, a second node, a third node, control signal detecting means for applying a signal at said predetermined logic level to said second node when the potential of at least one of said first node and said third node has the same level as the level of said control signal, and fixing means responsive to the potential of said second node attaining said predetermined logic level, for fixing the potential of said third node to the same level as the level of said control signal.

18. The semiconductor memory device according to claim 17, wherein said control signal detecting means includes first logical circuit means for forming a logical product signal of the potential of said first node and the potential of said third node, and said fixing means includes second logical circuit means for forming a logical product signal of the potential of said second node and the potential at said predetermined logic level.

19. The semiconductor memory device according to claim 17, further comprising reset means for resetting the potential of said second node to a logic level opposite to said predetermined logic level when said semiconductor memory device starts to operate.

20. A semiconductor memory device, comprising:

a normal memory cell array having a plurality of normal memory cells arranged in a plurality of rows and a plurality of columns;

a first spare memory cell array having first spare memory cells capable of replacing said memory cells arranged in any one of said plurality of rows;

a second spare memory cell array having second spare memory cells capable of replacing said nominal memory cells arranged in any one of said plurality of columns;

first normal selection means for selecting one of said normal memory cells arranged in any one of said plurality of rows for writing and reading data;

second normal selection means for selecting one of said normal memory cells arranged in any one of said plurality of columns for writing and reading data;

first spare selection means for selecting one of said first spare memory cells in place of one of said plurality of normal memory cells;

second spare selection means for selecting one of said second spare memory cells in place of one of said plurality of normal memory cells;

first control signal providing means for providing a first control signal which activates said first spare selection means and deactivates said first normal selection means to use said first spare memory cell array;

second control signal providing means for providing a second control signal which activates said second spare selection means and deactivates said second normal selection means to use said second spare memory cell array;

first electric circuit means which is set to provide a first particular electric signal to a first external terminal in response to said first control signal; and second electric circuit means which is set to provide a second particular electric signal to a second external terminal in response to said second control signal.

21. The semiconductor memory device according to claim 20, wherein said first electric circuit means includes:

first holding means responsive to said first control signal for holding a signal at a predetermined logic level; and first providing means responsive to said signal at said predetermined logic level held in said first holding means for providing said first particular electric signal to said first external terminal, and said second electric circuit means includes:

second holding means responsive to said second control signal for holding a signal at said predetermined logic level; and second providing means responsive to said signal at said predetermined logic level held in said second holding means for providing said second particular electric signal to said second external terminal.

22. A semiconductor memory device, comprising:

a normal memory cell array having a plurality of normal memory cells arranged in a plurality of rows and a plurality of columns;

a first spare memory cell array having first spare memory cells capable of replacing said memory cells arranged in any one of said plurality of rows;

a second spare memory cell array having second spare memory cells capable of replacing said normal memory cells arranged in any one of said plurality of columns;

first normal selection means for selecting said normal memory cells arranged in any one of said plurality of rows for writing and reading data;

second normal selection means for selecting said normal memory cells arranged in one of said plurality of columns for writing and reading data;

first spare selection means for selecting one of said first spare memory cells in place of one of said plurality of normal memory cells;

second spare selection means for selecting one of said second spare memory cells in place of one of said plurality of normal memory cells;

first control signal providing means for providing a first control signal which activates said first spare selection means and deactivates said first normal selection means to use said first spare memory cell array;

second control signal providing means for providing a second control signal which activates said second spare selection means and deactivates said second normal selection means to use said second spare memory cell array; and electric circuit means which is set to provide a particular electric signal to a predetermined external terminal in response to each of said first control signal and said second control signal, wherein said electric circuit means comprises means for supplying said external terminal with said particular electric signal continuously after selecting said first and second spare memory cells during writing and reading data.

23. The semiconductor memory device according to claim 22, wherein said electric circuit means includes:

first holding means responsive to said first control signal for holding a signal at a predetermined logic level;

second holding means responsive to said second control signal for holding said signal at said predetermined logic level;

detecting means for detecting that at least one of a signal held in said first holding means and signal held in said second holding means is a signal at said predetermined logic level; and providing means responsive to a detected output of said detecting means for providing said particular electric signal to said predetermined external terminal.

24. A method of determining whether a spare memory cell array is used or not from a signal provided to an external terminal in a semiconductor memory device comprising a normal memory cell array having a plurality of normal memory cells, said spare memory cell array having spare memory cells each being capable of replacing any one of said plurality of normal memory cells, normal selection means for selecting one of said plurality of normal memory cells for writing and reading data, spare selection means for selecting one of said spare memory cells in place of any one of said plurality of normal memory cells, and electric circuit means for providing a particular electric signal indicating that said spare memory cell array is used to said external terminal, said method comprising the steps of:

generating a control signal which activates said spare selection means and deactivates said normal selection means to use said spare memory cell array; and making said electric circuit means operate in response to said control signal, wherein said step of making includes supplying said external terminal by said electric circuit means with an indication signal continuously after selecting one of said spare memory cells during writing and reading data.

25. The semiconductor memory device according to claim 20, wherein said first and second electric circuit means comprises means for supplying said first and second external terminals with said first and second particular electric signals continuously after selecting said first and second spare memory cells during writing and reading data.

26. A semiconductor memory device, comprising:
a normal memory cell array having a plurality of normal memory cells;
a spare memory cell array having spare memory cells each being capable of replacing any one of said plurality of normal memory cells;
normal selection means for selecting any one of said plurality of normal memory cells for writing and reading data;
spare selection means for selecting one of said spare memory cells in place of any one of said plurality of normal memory cells;
control signal providing means for providing a control signal which activates said spare selection means and deactivates said normal selection means to use said spare memory cell array; and
electric circuit means which is set to provide a particular electric signal to a predetermined external terminal in response to said control signal;
wherein said electric circuit means includes:
means responsive to said control signal for holding a signal at a predetermined logic level; and
means responsive to said signal at the predetermined logic level held by said holding means for providing said particular electric signal to said predetermined external terminal, and
said providing means includes:
current generating means responsive to application of a predetermined potential to said predetermined external terminal for generating current which flows between said predetermined external terminal and said providing means; and
current increasing means responsive to said signal at the predetermined logic level held by said holding means for increasing said current.

27. A semiconductor memory device, comprising:
a normal memory cell array having a plurality of normal memory cells;
a spare memory cell array having spare memory cells each being capable of replacing any one of said plurality of normal memory cells;
normal selection means for selecting any one of said plurality of normal memory cells for writing and reading data; spare selection means for selecting one of said spare memory cells in place of any one of said plurality of normal memory cells;
control signal providing means for providing a control signal which activates said spare selection means and deactivates said normal selection means to use said spare memory cell array; and
electric circuit means which is set to provide a particular electric signal to a predetermined external terminal in response to said control signal;
wherein said electric circuit means includes:
means responsive to said control signal for holding a signal at a predetermined logic level; and
means responsive to said signal at the predetermined logic level held by said holding means for providing said particular electric signal to said predetermined external terminal,
said providing means includes application potential switching means for applying a potential at a first logic level to said predetermined external terminal when a signal held in said holding means is a signal at said predetermined logic level and applying a potential at a second logic level to said predetermined external terminal when said held signal is a signal at another logic level,
said application potential switching means includes first switching means coupled between a potential at said first logic level and said predetermined external terminal, second switching means coupled between a potential at said second logic level and said predetermined external terminal, and control means responsive to said signal held in said holding means for controlling said first and second switching means,
said control means is responsive to said signal at the predetermined logic level held in said holding means for turning on said first switching means and turning off said second switching means,
said control means is activated in response to a predetermined activating signal, and includes:
first logical circuit means for forming a logical product signal of said signal held in said holding means and said predetermined activating signal;
inverter means for inverting said signal held in said holding means; and
second logical circuit means for forming a logical product signal of said signal inverted by said inverter means and said predetermined activating signal,
wherein said first switching means is controlled by said signal formed by said first logical circuit means, and said second switching means is controlled by said signal formed by said second logic circuit means.

28. The semiconductor memory device according to claim 27, wherein said first switching means includes a first field effect semiconductor element, which has a first conduction terminal for receiving a potential at said first logic level, a second conduction terminal connected to said predetermined external terminal, and a control terminal receiving said signal formed by said first logical circuit means, and said second switching means includes a second field effect semiconductor element, which has a first conduction terminal for receiving a potential at said second logic level, a second conduction terminal connected to said predetermined external terminal, and a control terminal for receiving said signal formed by said second logical circuit means.

29. The semiconductor memory device according to claim 28, wherein said first logic level is a high level, said second logic level is a low level, said predetermined logic level is the high level, and the polarity of each of said first and second field effect semiconductor element is N type.

30. The semiconductor memory device according to claim 27, wherein each of said first and second logical circuit means includes a two-input NAND gate and an inverter for inverting an output signal of said NAND gate.

31. A semiconductor memory device, comprising:
a normal memory cell array having a plurality of normal memory cells arranged in a plurality of rows and a plurality of columns;
a first spare memory cell array having first spare memory cells capable of replacing said memory cells arranged in any one of said plurality of rows;
a second spare memory cell array having second spare memory cells capable of replacing said normal memory cells arranged in any one of said plurality of columns;
first normal selection means for selecting said normal memory cells arranged in any one of said plurality of rows for writing and reading data;
second normal selection means for selecting said normal memory cells arranged in one of said plurality of columns for writing and reading data;
first spare selection means for selecting one of said first spare memory cells in place of one of said plurality of normal memory cells;
second spare selection means for selecting one of said second spare memory cells in place of one of said plurality of normal memory cells;
first control signal providing means for providing a first control signal which activates said first spare selection means and deactivates said first normal selection means to use said first spare memory cell array;
second control signal providing means for providing a second control signal which activates said second spare selection means and deactivates said second normal selection means to use said second spare memory cell array; and
electric circuit means which is set to provide a particular electric signal to a predetermined external terminal in response to each of said first control signal and said second control signal,
wherein said electric circuit means includes:
first holding means responsive to said first control signal for holding a signal at a predetermined logic level;
second holding means responsive to said second control signal for holding said signal at said predetermined logic level;
detecting means for detecting that at least one of a signal held in said first holding means and signal held in said second holding means is a signal at said predetermined logic level; and
providing means responsive to a detected output of said detecting means for providing said particular electric signal to said predetermined external terminal.

* * * * *